(12) United States Patent
Chino et al.

(10) Patent No.: US 8,436,471 B2
(45) Date of Patent: May 7, 2013

(54) SEMICONDUCTOR PACKAGE WITH ITS SURFACE EDGE COVERED BY RESIN

(75) Inventors: Teruaki Chino, Nagano (JP); Akihiko Tateiwa, Nagano (JP); Fumimasa Katagiri, Tempe, AZ (US)

(73) Assignee: Shinko Electric Industries Co., Ltd., Nagano (JP)

( * ) Notice: Subject to any disclaimer, the term of this patent is extended or adjusted under 35 U.S.C. 154(b) by 270 days.

(21) Appl. No.: 12/839,473

(22) Filed: Jul. 20, 2010

(65) Prior Publication Data

US 2011/0049726 A1 Mar. 3, 2011

(30) Foreign Application Priority Data

Sep. 1, 2009 (JP) ................................. 2009-201299

(51) Int. Cl.
*H01L 23/49* (2006.01)
(52) U.S. Cl.
USPC .... 257/773; 257/787; 257/788; 257/E21.502; 257/E21.509
(58) Field of Classification Search .......... 257/787–794, 257/773
See application file for complete search history.

(56) References Cited

U.S. PATENT DOCUMENTS

| 6,225,146 | B1 * | 5/2001 | Yamaguchi et al. | 438/123 |
| 8,088,650 | B2 * | 1/2012 | Qiao et al. | 438/123 |
| 2008/0017999 | A1 * | 1/2008 | Kikuchi et al. | 257/787 |

FOREIGN PATENT DOCUMENTS

| JP | 09-064236 | 3/1997 |
| JP | 2001-217381 | 8/2001 |
| WO | WO02/15266 A2 | 2/2002 |
| WO | WO02/33751 A2 | 4/2002 |

OTHER PUBLICATIONS

Office Action dated Mar. 5, 2013 issued with respect to the basic Japanese Patent Application No. 2009-201299.

* cited by examiner

*Primary Examiner* — Thanh Nguyen
(74) *Attorney, Agent, or Firm* — IPUSA, PLLC

(57) ABSTRACT

A semiconductor package includes a semiconductor chip; a resin part configured to cover a side surface of the semiconductor chip; and a wiring structure formed on a circuit forming surface of the semiconductor chip and a surface of the resin part being situated at the same side as the circuit forming surface, the wiring structure being electrically connected to the semiconductor chip, wherein the resin part is formed so as to cover a part of a surface of the semiconductor chip situated at an opposite side to the circuit forming surface of the semiconductor chip.

7 Claims, 31 Drawing Sheets

US 8,436,471 B2

SEMICONDUCTOR PACKAGE WITH ITS SURFACE EDGE COVERED BY RESIN

CROSS-REFERENCE TO RELATED APPLICATIONS

This patent application is based upon and claims the benefit of priority of Japanese Patent Application No. 2009-201299 filed on Sep. 1, 2009, the entire contents of which are incorporated herein by reference.

BACKGROUND OF THE INVENTION

1. Field of the Invention

The present invention generally relates to semiconductor packages and manufacturing methods of the semiconductor packages. More specifically, the present invention relates to a semiconductor package including a semiconductor chip, a resin part configured to cover a part of the semiconductor chip, and a wiring structure configured to electrically connect to the semiconductor chip; and a manufacturing method of the semiconductor package.

2. Description of the Related Art

Conventionally, a semiconductor package including a semiconductor chip, a resin part configured to cover a part of the semiconductor chip, and a wiring structure configured to be electrically connected to a semiconductor chip has been known. An example of such a semiconductor package is discussed below.

FIG. 1 is a cross-sectional view showing a related art semiconductor package. As shown in FIG. 1, a semiconductor package 100 includes a semiconductor chip 200, a resin part 300, and a wiring structure 400.

The semiconductor chip 200 includes a chip main body 210 and electrode pads 220. The chip main body 210 has a structure where a semiconductor integrated circuit (not shown in FIG. 1) and others are formed on a thin plate semiconductor substrate (not shown in FIG. 1) made of silicon. The electrode pads 220 are formed on the chip main body 210. Surfaces 220a of the electrode pads 220 are exposed from a surface of the chip main body 210. The electrode pads 220 are electrically connected to the semiconductor integrated circuit (not shown in FIG. 1) of the chip main body 210. A surface 200a of the semiconductor chip 200, which is a surface of the chip main body 210 where the electrode pads 220 are formed, is flat. In other words, the surfaces 220a of the electrode pads 220 are substantially flush with the surface of the chip main body 210.

The resin part 300 is provided so as to cover a surface 200b which is a side surface of the semiconductor chip 200. The resin part 300 is not provided on the surface 200a of the semiconductor chip 200 and a surface 200c which is an opposite surface of the surface 200a. The surfaces 200a and 200c of the semiconductor chip 200 are completely exposed from (not covered by) the resin part 300. In other words, the resin part 300 comes in contact with only the surface 200b of the semiconductor chip 200 and does not come in contact with the surfaces 200a and 200c of the semiconductor chip 200. A surface 300a of the resin part 300 is substantially flush with the surface 200a of the semiconductor chip 200 (the surfaces 220a of the electrode pads 220 and the surface of the chip main body 210). In addition, a surface 300b of the resin part 300 is substantially flush with the surface 200c of the semiconductor chip 200. In the semiconductor chip 200, the surface 200a may be called a circuit forming surface; the surface 200b may be called a side surface; and the surface 200c may be called a rear surface.

The wiring structure 400 includes a first wiring layer 410, a second wiring layer 420, a third wiring layer 430, a first insulation layer 440, a second insulation layer 450, a third insulation layer 460, and a solder resist layer 470.

The first insulation layer 440 is formed on the surface 200a of the semiconductor chip 200 and the surface 300a of the resin part 300. The first wiring layer 410 is formed on the first insulation layer 440. The first wiring layer 410 is electrically connected to the electrode pads 220 of the semiconductor chip 200 via first via-holes 440x piercing the first insulation layer 440. The second insulation layer 450 is formed on the first insulation layer 440 so as to cover the first wiring layer 410.

The second wiring layer 420 is formed on the second insulation layer 450. The second wiring layer 420 is electrically connected to the first wiring layer 410 via second via holes 450x piercing the second insulation layer 450. The third insulation layer 460 is formed on the second insulation layer 450 so as to cover the second wiring layer 420. The third wiring layer 430 is formed on the third insulation layer 460. The third wiring layer 430 is electrically connected to the second wiring layer 420 via third via holes 460x piercing the third insulation layer 460.

The solder resist layer 470 is formed on the third insulation layer 460 so as to cover the third wiring layer 430. The solder resist layer 470 has opening parts 470x in which parts of the third wiring layer 430 are exposed. The third wiring layer 430 exposed in the opening parts 470x of the solder resist layer 470 functions as electrode pads connected to a motherboard and others.

FIG. 2 through FIG. 6 are views showing a manufacturing process of the related art semiconductor package. In FIG. 2 through FIG. 6, parts that are the same as the parts shown in FIG. 1 are given the same reference numerals, and explanation thereof may be omitted. In each of FIG. 2 through FIG. 5, (a) is a plan view and (b) is a cross-sectional view taken along a line A-A. The manufacturing process of the related art semiconductor package is discussed with reference to FIG. 2 through FIG. 6. In FIG. 2 through FIG. 5, illustration of the electrode pads 220 is omitted.

First, in a step shown in FIG. 2, a semiconductor wafer is cut into pieces so that plural semiconductor chips 200 are manufactured. Then, the plural semiconductor chips 200 are provided on a surface 500a of a supporting body 500 so that the surfaces (circuit forming surface) 200a face a surface 500a of the supporting body 500. Plural semiconductor chips 200 can be fixed to the surface 500a of the supporting body 500 by, for example, an adhesive material (not shown in FIG. 2).

Next, in a step shown in FIG. 3, the resin part 300 is formed on the surface 500a of the supporting body 500 by press molding or the like. The resin part 300 is configured to seal plural semiconductor chips 200. More specifically, epoxy resin or the like which is a material of the resin part 300 is applied on the surface 500a of the supporting body 500 so that plural semiconductor chips 200 are sealed. In addition, by heating and pressing the epoxy resin or the like, the epoxy resin is cured so that the resin part 300 is formed.

Next, in a step shown in FIG. 4, the supporting body 500 is removed. The supporting body 500 can be removed by using, for example, an etching technique. Furthermore, in a case where the supporting body is fixed to the semiconductor chip 200 and the resin part 300 by a heat peeling tape, the supporting body 500 can be removed by applying designated heat. As a result of this, the surfaces 200a of the semiconductor chips 200 are exposed from the surface 300a of the resin part 300.

Next, in a step shown in FIG. 5, a part of the resin part 300 covering the surfaces 200c of the semiconductor chips 200 is removed so that the surfaces 200c of the semiconductor chips 200 are exposed from the surface 300b of the resin part 300. As a result of this, the resin part 300 comes in contact with only the surface (side surface) 200b of the semiconductor chip 200 and therefore the surfaces 200a and 200c are exposed from the resin part 300. The reason why a part of the resin part 300 covering the surface 200c of the semiconductor chip 200 is removed is to transfer the heat generated by the semiconductor chip 200. If a part of the resin part 300 covering the surface 200c of the semiconductor chip 200 is not removed, the temperature of the semiconductor chip 200 is increased so that operation of the semiconductor chip 200 may be obstructed.

Next, in a step shown in FIG. 6, by a known method, the first insulation layer 440, the first wiring layer 410, the second insulation layer 450, the second wiring layer 420, the third insulation layer 460, the third wiring layer 430, and the solder resist layer 470 having the opening parts 470x are formed, in this order, on the surface 200a of the semiconductor chip 200 and the surface 300a of the resin part 300. After the step shown in FIG. 6, by cutting the structural body shown in FIG. 6 in cutting positions C, the semiconductor package 100 shown in FIG. 1 is completed. See International Publication Official Gazette No. 02/33751 and International Publication Official Gazette No. 02/15266.

However, in the manufacturing method of the related art semiconductor package, as shown in FIG. 5, in order to transfer heat generated by the semiconductor chip 200, the surface (rear surface) 200c of the semiconductor chip 200 is exposed from the resin part 300. As a result of this, the semiconductor chip 200 is fixed to the resin part 300 by only the surface (side surface) 200b. Therefore, it is not possible to secure a sufficient area of the contact part between the semiconductor chip 200 and the resin part 300. As a result of this, the semiconductor chip 200 may fall down (separate) from the resin part 300 and the strength of the semiconductor package 100 may not be sufficient.

SUMMARY OF THE INVENTION

Accordingly, embodiments of the present invention may provide a novel and useful semiconductor package and manufacturing method of the semiconductor package solving one or more of the problems discussed above.

More specifically, the embodiments of the present invention may provide a semiconductor package whereby it is possible to prevent a semiconductor chip from falling down from a resin part so that strength of the semiconductor package can be improved, and also provide a manufacturing method of the semiconductor package.

Another aspect of the embodiments of the present invention may be to provide a semiconductor package, including:
 a semiconductor chip;
 a resin part configured to cover a side surface of the semiconductor chip; and
 a wiring structure formed on a circuit forming surface of the semiconductor chip and a surface of the resin part being situated at the same side as the circuit forming surface, the wiring structure being electrically connected to the semiconductor chip,
 wherein the resin part is formed so as to cover a part of a surface of the semiconductor chip situated at an opposite side to the circuit forming surface of the semiconductor chip.

Another aspect of the embodiments of the present invention may be to provide a manufacturing method of a semiconductor package, including:
 a step of forming a metal layer on an opposite surface with respect to a circuit forming surface of a semiconductor chip so that a part of the opposite surface is exposed;
 a step of mounting the semiconductor chip where the metal layer is formed on a supporting body;
 a step of forming a resin part so as to cover a side surface of the semiconductor chip and the part of the opposite surface of the semiconductor chip, the part being exposed with respect to the metal layer;
 a step of removing the metal layer;
 a step of removing the supporting body; and
 a step of forming a wiring structure on the circuit forming surface of the semiconductor chip and a surface of the resin part being situated at the same side as the circuit forming surface, the wiring structure being electrically connected to the semiconductor chip.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 7 through FIG. 31 of embodiments of the present invention. In the plan views and bottom views which will be referred to, for the purpose of making relationship with cross sectional views clear, the same hatching as that applied to the cross-sectional views may be applied to the plan views and the bottom views.

First Embodiment

Structure of Semiconductor Package of the First Embodiment

Figure 1:
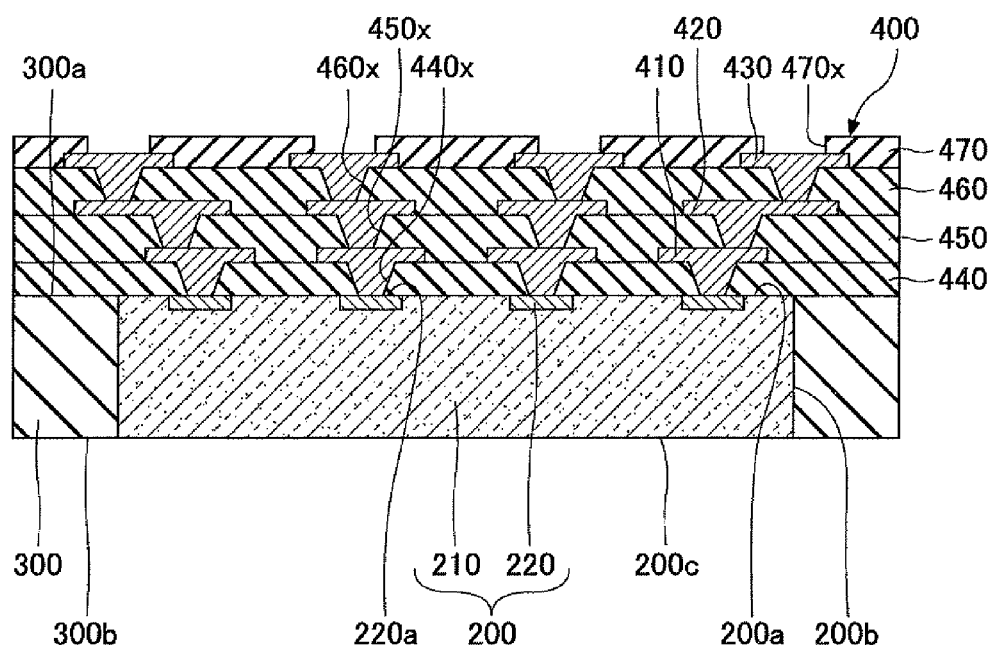
FIG. 1 is a cross-sectional view showing a related art semiconductor package.
Figure 2:
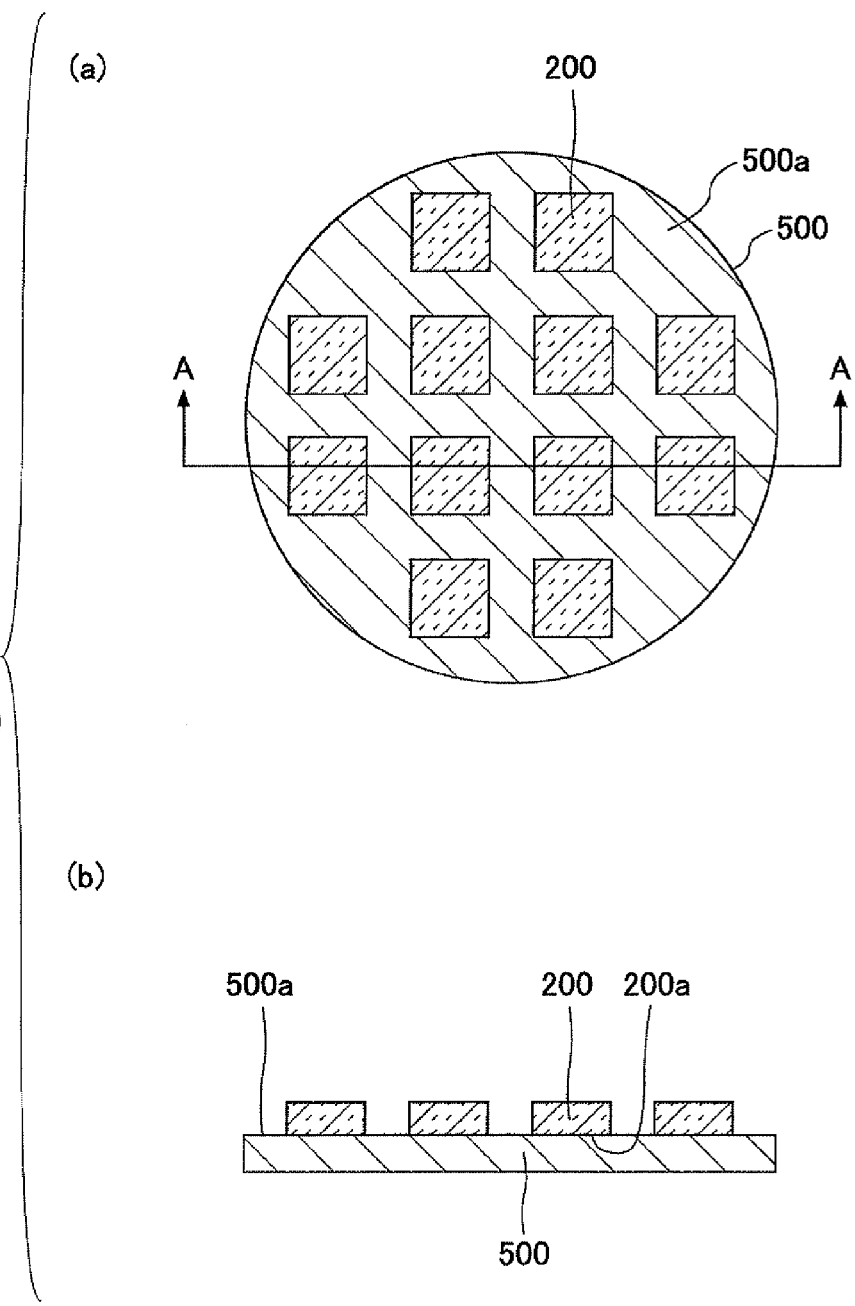
FIG. 2 is a first view showing a manufacturing process of the related art semiconductor package.
Figure 3:
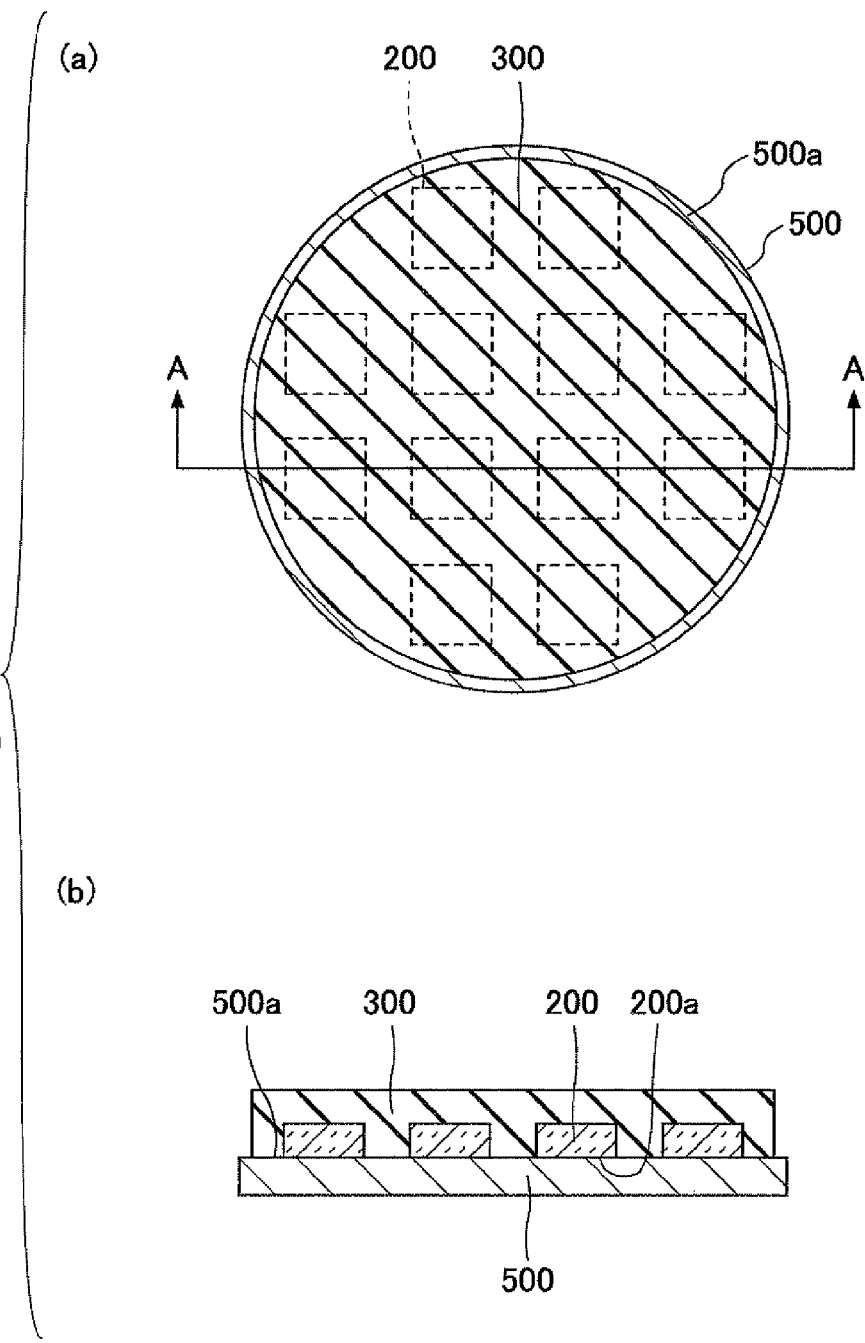
FIG. 3 is a second view showing the manufacturing process of the related art semiconductor package.
Figure 4:
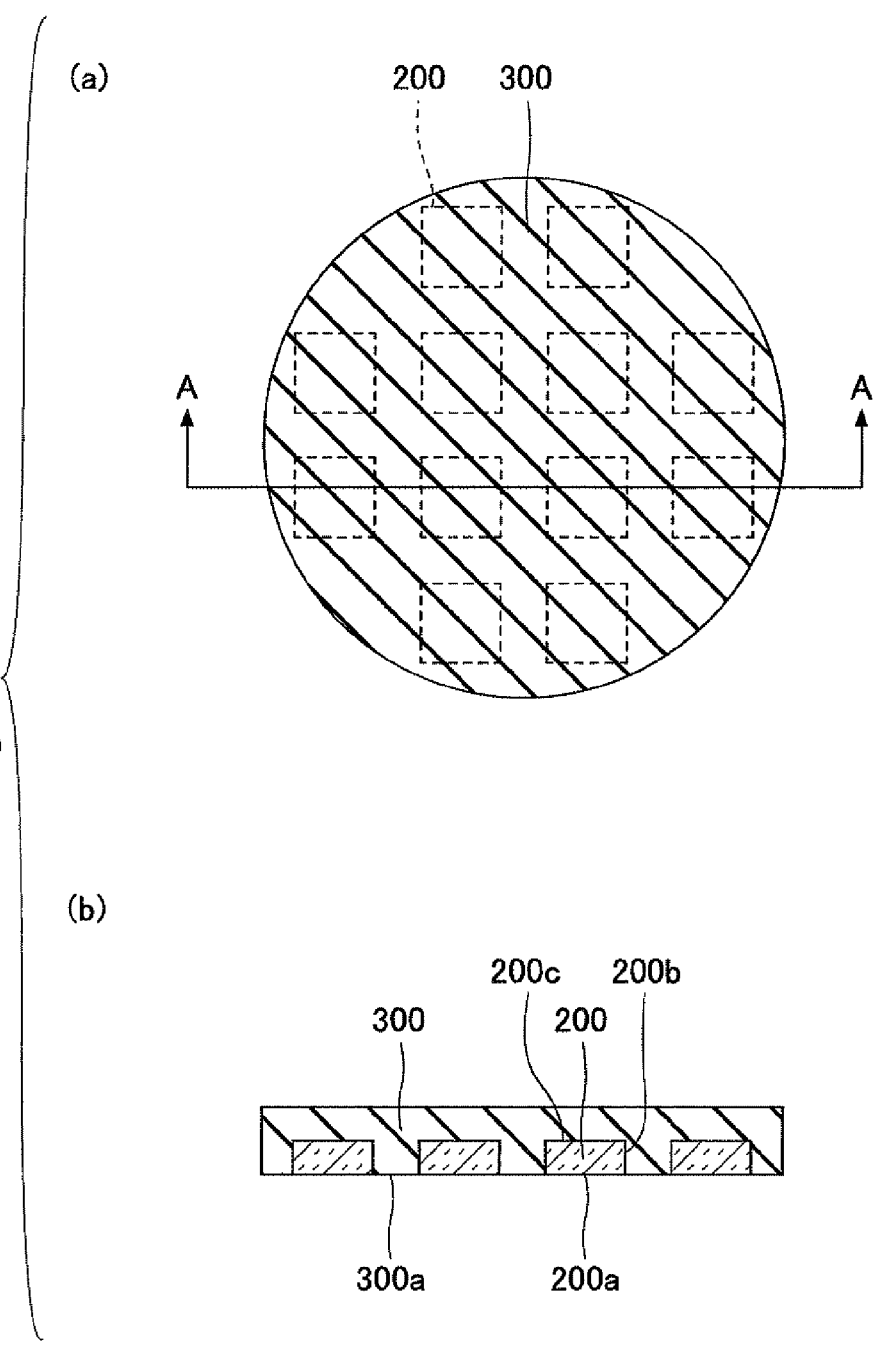
FIG. 4 is a third view showing the manufacturing process of the related art semiconductor package.
Figure 5:
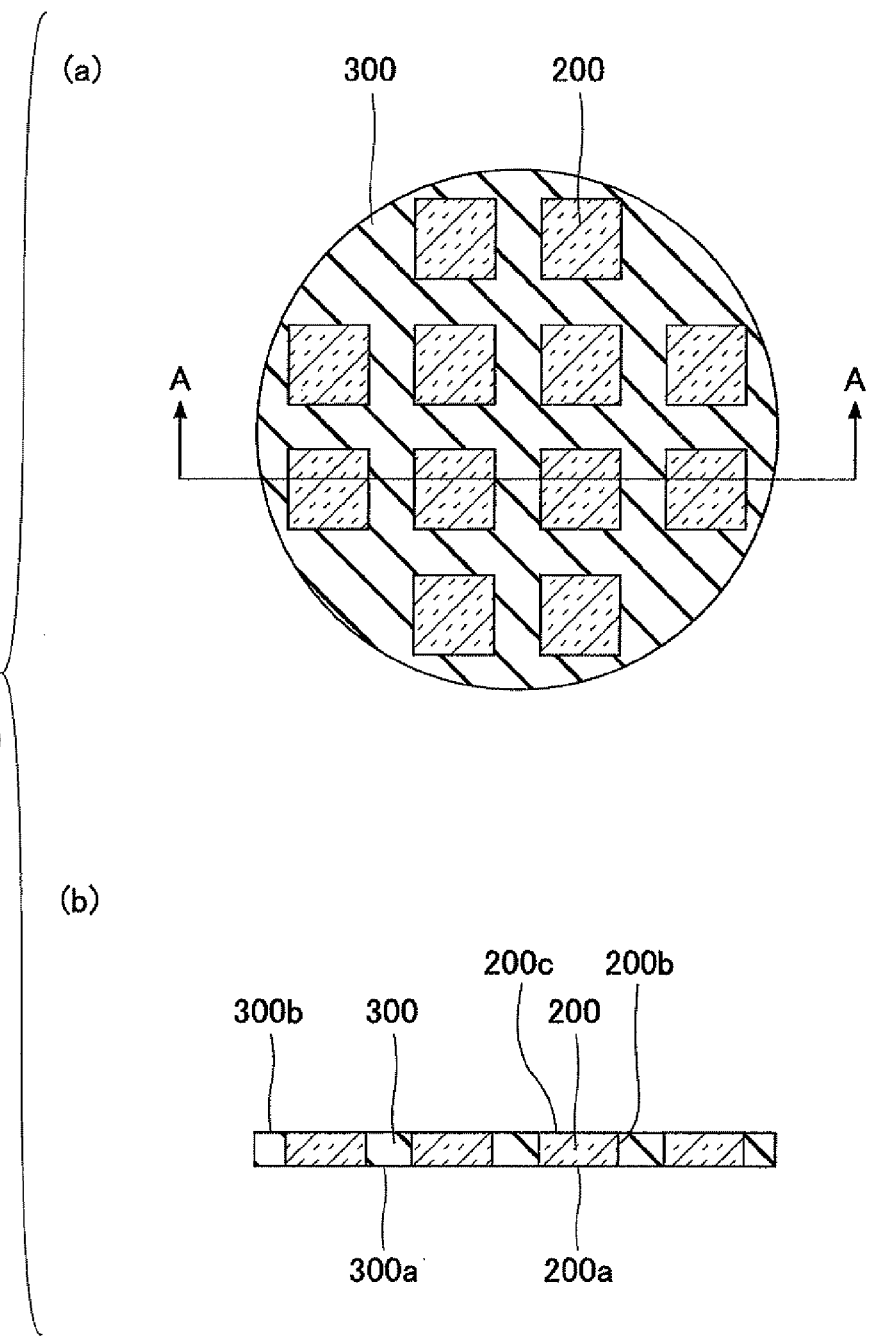
FIG. 5 is a fourth view showing the manufacturing process of the related art semiconductor package.
Figure 6:
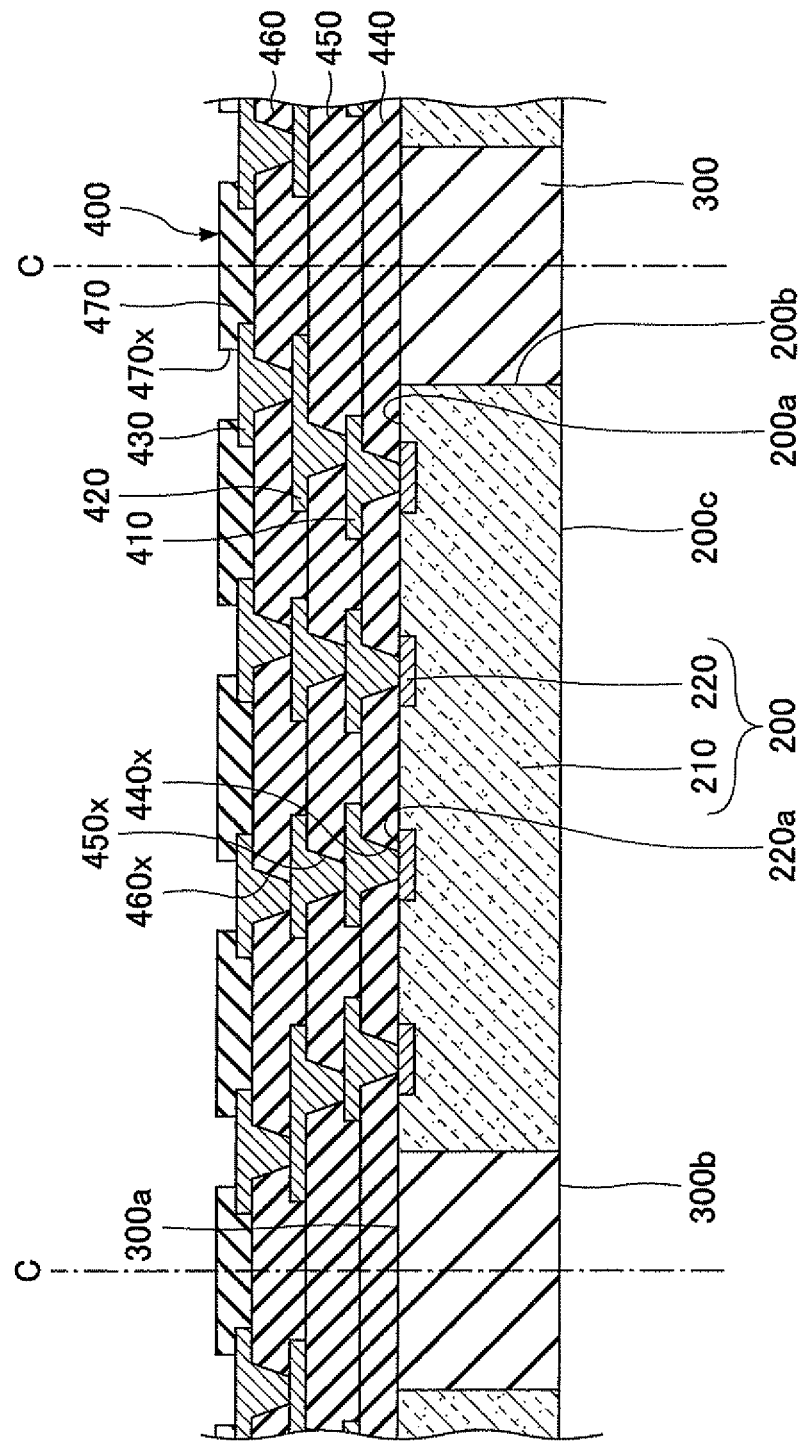
FIG. 6 is a fifth view showing the manufacturing process of the related art semiconductor package.
Figure 7:
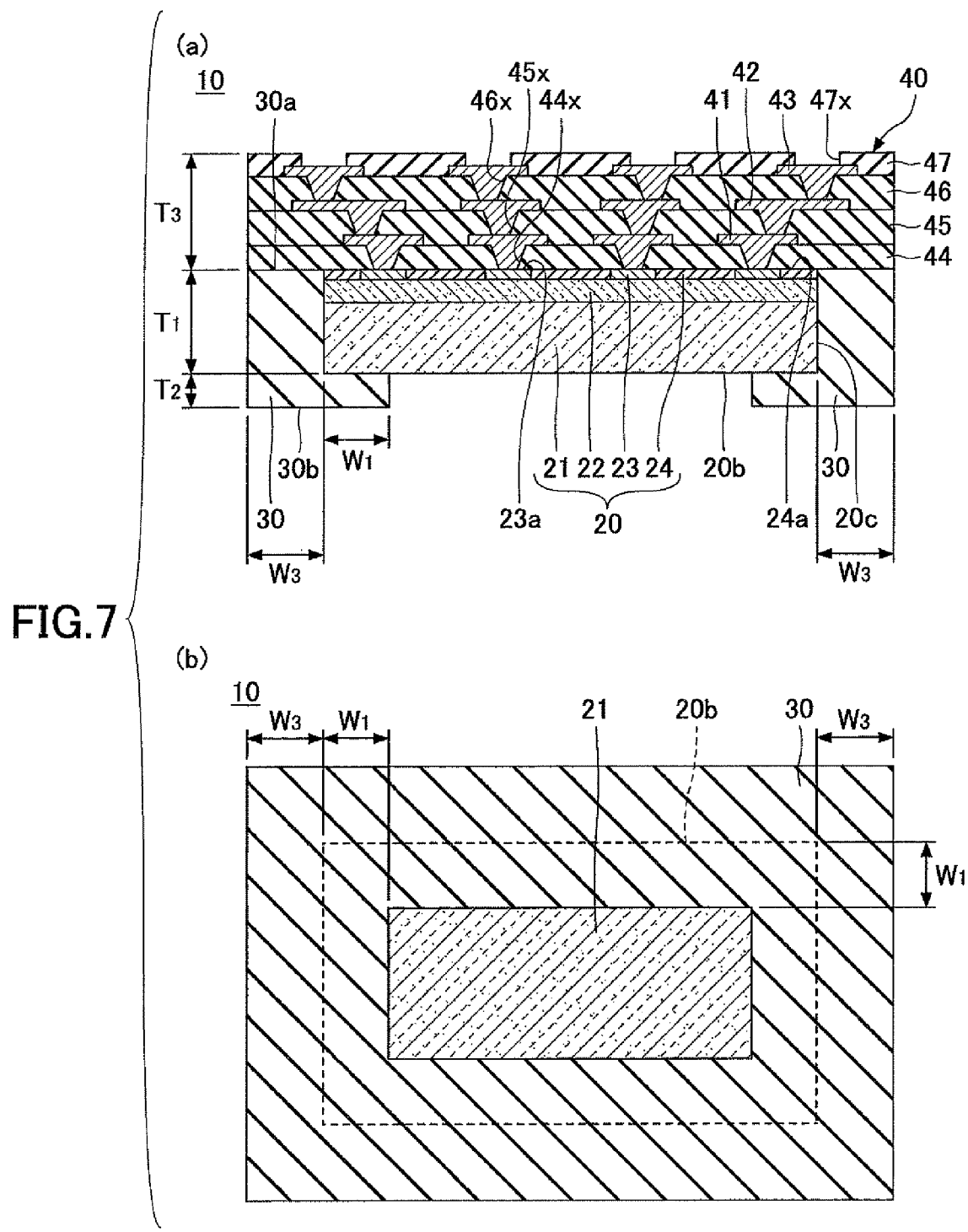
FIG. 7 is a view showing a semiconductor package of a first embodiment of the present invention.

FIG. 7 is a view showing a semiconductor package 10 of a first embodiment of the present invention. In FIG. 7, (a) is a cross-sectional view and (b) is a bottom view. As shown in FIG. 7, the semiconductor package 10 includes a semiconductor chip 20, a resin part 30, and a wiring structure 40.

The semiconductor chip 20 includes a semiconductor substrate 21, a semiconductor integrated circuit 22, plural electrode pads 23, and a protection film 24. The semiconductor chip 20 may have a size (in planar view) of, for example, approximately 5 mm×approximately 10 mm. The semiconductor chip 20 may have a thickness $T_1$ equal to or greater than approximately 100 μm and equal to or smaller than approximately 800 μm, for example, approximately 800 μm. In the following explanation, in the semiconductor chip 20, a surface at a side where the electrode pads 23 are formed may be called a circuit forming surface.

The semiconductor substrate 21 may be, for example, a Si substrate. The semiconductor integrated circuit 22 includes a diffusion layer, an insulation layer, vias, a wiring, and others (not shown in FIG. 7). The electrode pads 23 are provided on and electrically connected to the semiconductor integrated circuit 22. As a material of the electrode pad 23, for example, Al or the like may be used. The electrode pad 23 may be where an Al layer is formed on a Cu layer or where the Al layer is formed on an Si layer being formed on the Cu layer.

The protection film 24 is provided on the semiconductor integrated circuit 22. The protection film 24 is configured to protect the semiconductor integrated circuit 22. The protection film 24 may be called a passivation film. As the protection film 24, for example, a SiN film, a PSG film, or the like can be used. A layer made of polyimide or the like may be further stacked on a layer made of the SiN film, the PSG film, or the like. A surface 24a of the protection film 24 is substantially flush with surfaces 23a of the electrode pads 23.

The resin part 30 is formed so as to cover a surface (side surface) 20c of the semiconductor chip 20 and cover an external edge part of the surface (rear surface) 20b in a frame manner. In the semiconductor chip 20, the surface (rear surface) 20b is a surface situated at a side opposite to the circuit forming surface. A surface 30a of the resin part 30 is substantially flush with the surfaces 23a of the electrode pads 23 and the surface 24a of the protection film 24 of the semiconductor chip 20. A thickness $T_2$ of a portion of the resin part 30 which covers the external edge part of the surface (rear surface) 20b in the frame manner may be equal to or greater than approximately 50 μm and equal to or smaller than approximately 150 μm, for example, approximately 100 μm. A width W1 of the portion of the resin part 30 which covers the external edge part of the surface (rear surface) 20b in the frame manner may be equal to or greater than approximately 50 μm and equal to or smaller than approximately 150 μm, for example, approximately 50 μm. It is not necessary for this entire frame-shaped portion to have the same fixed width. In addition, the width $W_3$ of the resin part may be equal to or greater than approximately 2 mm and equal to or smaller than approximately 5 mm, for example, approximately 2.5 mm.

The wiring structure 40 includes a first wiring layer 41, a second wiring layer 42, a third wiring layer 43, a first insulation layer 44, a second insulation layer 45, a third insulation layer 46, and a solder resist layer 47.

The wiring structure 40 is formed on the circuit forming surface of the semiconductor chip 20 and the surface 30a of the resin part 30 being situated at the same side as the circuit forming surface in a state where the semiconductor chip 20 and the resin part 30 configured to cover the surface (side surface) 20c of the semiconductor chip 20 are a base body. A thickness $T_3$ of the wiring structure 40 may be, for example, equal to or greater than approximately 50 μm and equal to or smaller than approximately 100 μm, for example, approximately 50 μm. In other words, the thickness $T_3$ of the wiring structure 40 (equal to or greater than approximately 50 μm and equal to or smaller than approximately 100 μm) is extremely less than the thickness $T_1$ of the semiconductor chip 20 (equal to or greater than approximately 100 μm and equal to or smaller than approximately 800 μm).

The first insulation layer 44 is formed on the surfaces 23a of the electrode pads 23 and the surface 24a of the protection film 24 of the semiconductor chip 20 and the surface 30a of the resin part 30. The first wiring layer 41 is formed on the first insulation layer 44. The first wiring layer 41 is electrically connected to the electrode pads 23 of the semiconductor chip 20 via first via holes 44x piercing the first insulation layer 44. The second insulation layer 45 is formed on the first insulation layer 44 so as to cover the first wiring layer 41.

The second wiring layer 42 is formed on the second insulation layer 45. The second wiring layer 42 is electrically connected to the first wiring layer 41 via second via holes 45x piercing the second insulation layer 45. The third insulation layer 46 is formed on the second insulation layer 45 so as to cover the second wiring layer 42. The third wiring layer 43 is formed on the third insulation layer 46. The third wiring layer 43 is electrically connected to the second wiring layer 42 via third via holes 46x piercing the third insulation layer 46.

The solder resist layer 47 is provided on the third insulation layer 46 so as to cover the third wiring layer 43. The solder resist layer 47 has opening parts 47x. Parts of the third wiring layer 43 are exposed in the opening parts 47x. The third wiring layer 43 exposed in the opening parts 47x of the solder resist layer 47 functions as electrode pads configured to be connected to a motherboard or the like.

A metal layer may be formed on the third wiring layer 43 exposed in the opening parts 47x of the solder resist layer 47. As an example of the metal layer, an Au layer, a Ni/Au layer where a Ni layer and the Au layer are stacked in this order, a Ni/Pd/Au layer where the Ni layer, a Pd layer, and the Au layer are stacked in this order, or the like may be applied. In addition, instead of providing the metal layer, an OSP (Organic Solderability Preservative) process may be applied onto the third wiring layer 43 exposed in the opening parts 47x of the solder resist layer 47.

Thus, in the semiconductor package 10, the wiring structure 40 is formed on the circuit forming surface of the semiconductor chip 20 and the surface 30a of the resin part 30 being situated at the same side as the circuit forming surface in a state where the semiconductor chip 20 and the resin part 30 configured to cover the surface (side surface) 20c of the semiconductor chip 20 are a base body. The resin part 30 is further formed so as to cover the external edge part of the surface (rear surface) 20b of the semiconductor chip 20 in a frame manner. Because of this, a part of the surface (rear surface) 20b of the semiconductor chip 20 is covered with the resin part 30. Another part of the surface (rear surface) 20b of the semiconductor chip 20 is exposed from the resin part 30. As a result of this, it is possible to prevent the semiconductor chip 20 from falling down from the resin part 30 without obstructing transfer of the heat generated by the semiconductor chip 20. In addition, it is possible to improve the strength of the semiconductor package 10.

[Manufacturing Method of Semiconductor Package of the First Embodiment]

Next, a manufacturing method of a semiconductor package of the first embodiment of the present invention is discussed. FIG. 8 through FIG. 23 are views showing a manufacturing process of the semiconductor package of the first embodiment. In FIG. 8 through FIG. 23, parts that are the same as the parts shown in FIG. 7 are given the same reference numerals, and explanation thereof is omitted. In each of FIG. 8 through FIG. 14, FIG. 16, and FIG. 17, (a) is a plan view; and (b) is a cross-sectional view taken along a line D-D in (a).

Figure 8:
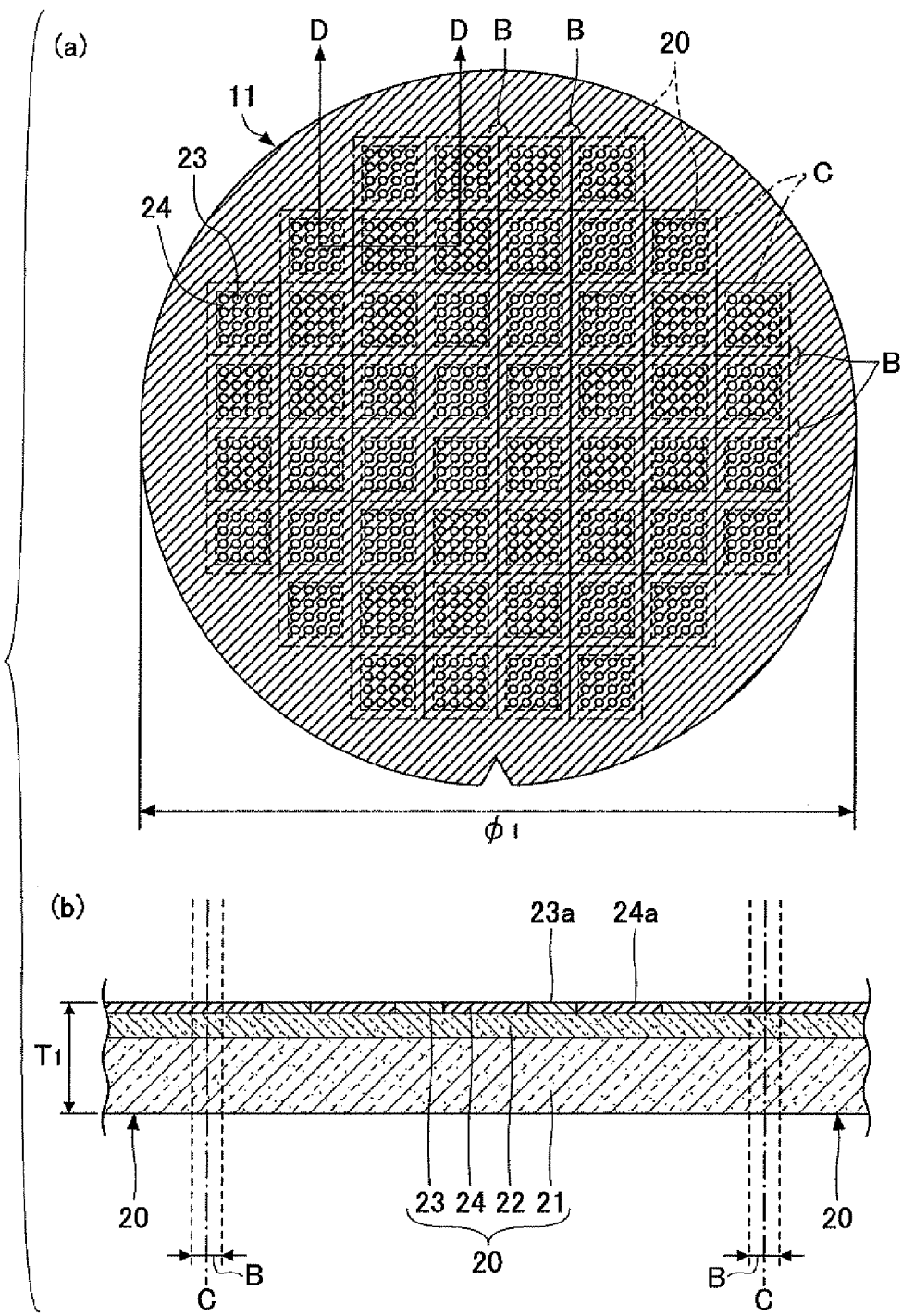
FIG. 8 is a first view showing a manufacturing process of the semiconductor package of the first embodiment.

First, in a step shown in FIG. 8, a semiconductor wafer 11 having plural of the semiconductor chips 20 is provided. In the semiconductor wafer 11, a scribe region B is where the semiconductor chips 20 are to be separated from each other. A cutting position C is where the semiconductor wafer 11 is to be cut by a dicing blade or the like. A diameter $\phi_1$ of the semiconductor wafer 11 may be, for example, approximately 200 mm. The semiconductor wafer 11 may have a thickness $T_1$ equal to or greater than approximately 100 µm and equal to or smaller than approximately 800 µm, for example, approximately 800 µm. Details of the semiconductor chip 20 are as discussed above.

Figure 9:
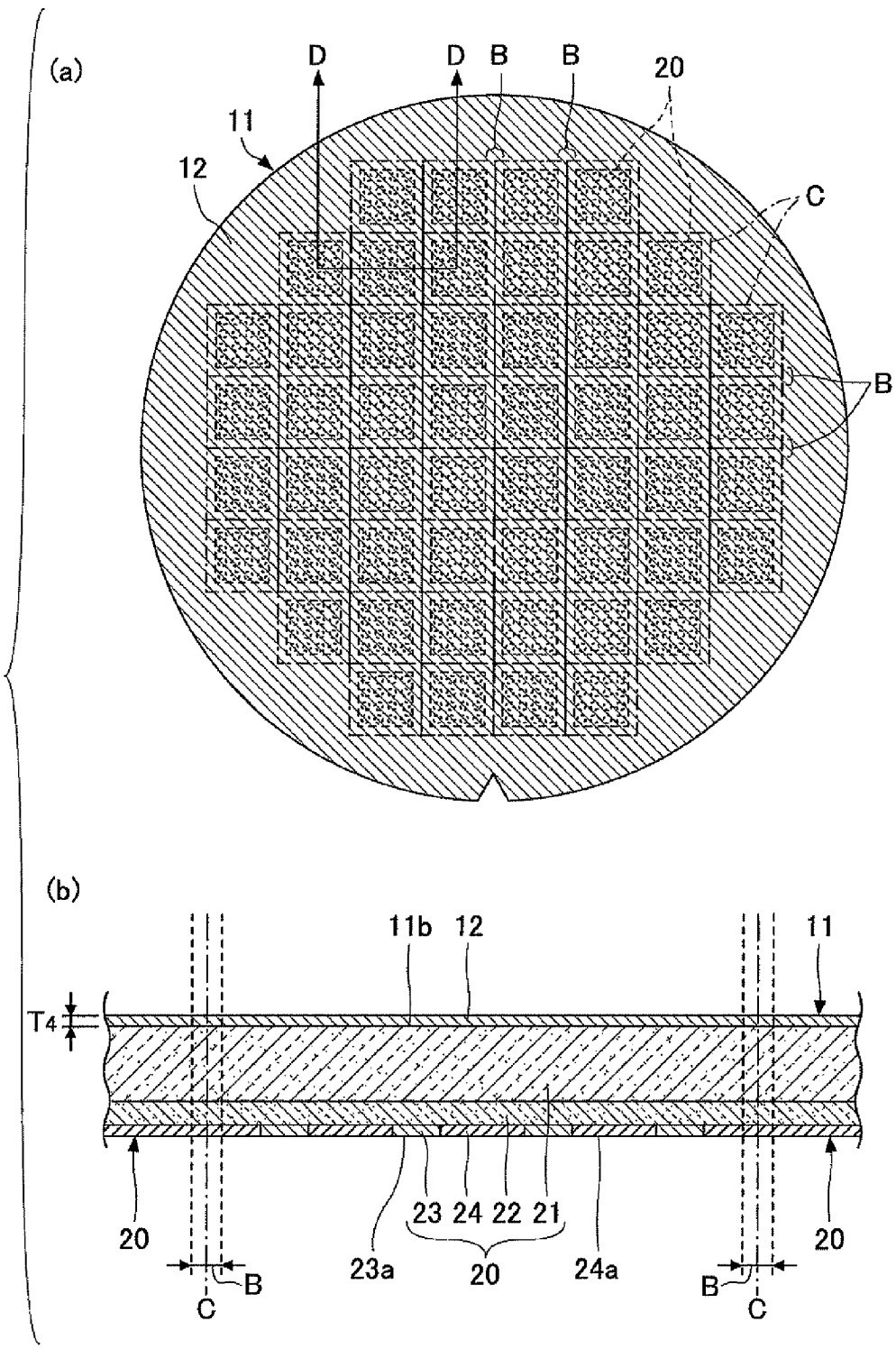
FIG. 9 is a second view showing a manufacturing process of the semiconductor package of the first embodiment.

Next, in a step shown in FIG. 9, a seed layer 12 is formed on the surface (rear surface) 11b of the semiconductor wafer 11 by, for example, a sputtering method or the like. The seed layer 12 functions as a power feeding layer when a metal layer 14 is formed in a step shown in FIG. 14. As a material of the seed layer 12, for example, copper (Cu), nickel (Ni), or the like can be used. The thickness $T_4$ of the seed layer 12 can be, for example, several µm. FIG. 9 through FIG. 17 are shown by reversing FIG. 8 in an up-side-down manner.

Figure 10:
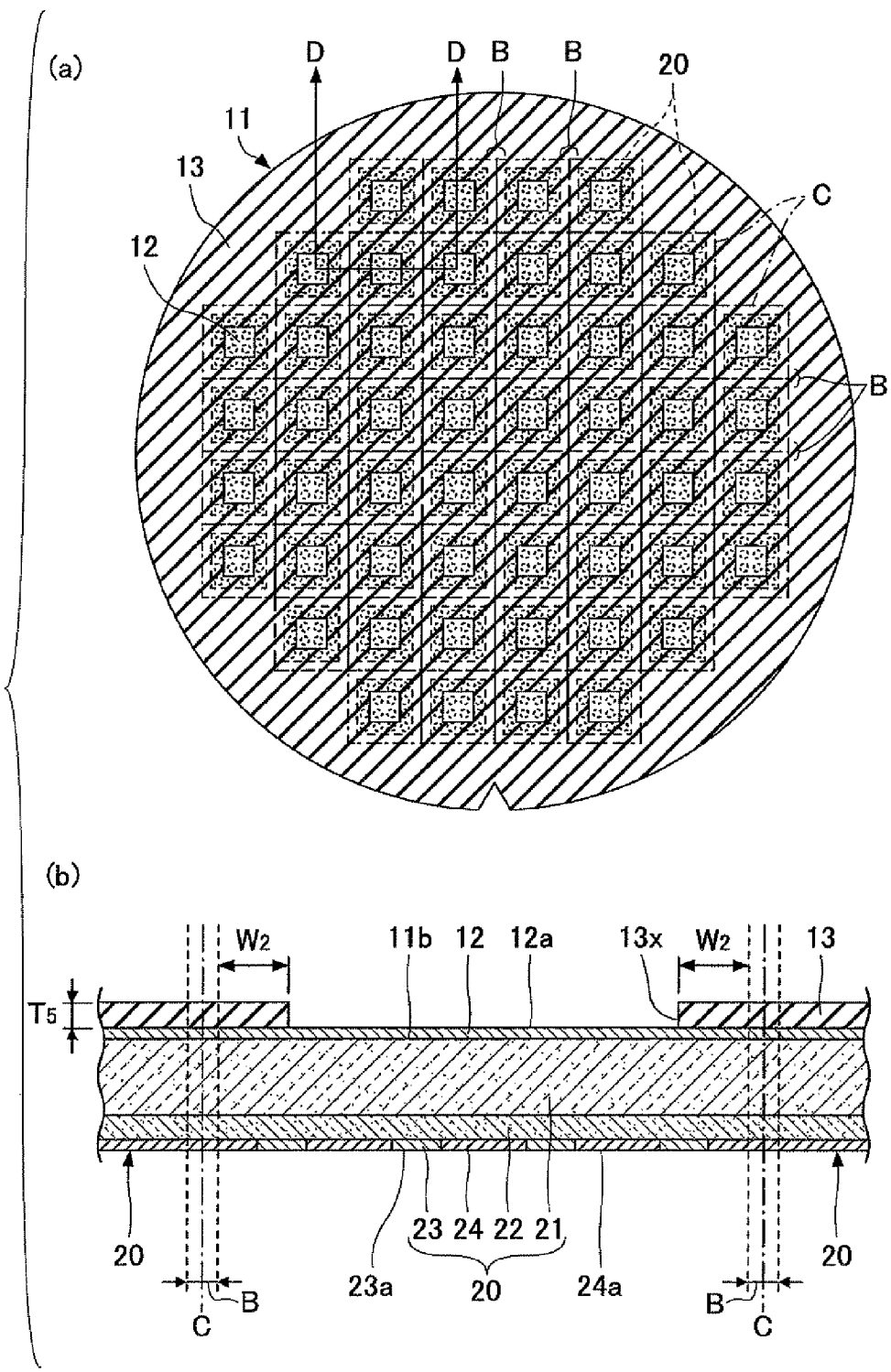
FIG. 10 is a third view showing a manufacturing process of the semiconductor package of the first embodiment.

Next, in a step shown in FIG. 10, a resist layer 13 having an opening part 13x is formed on a surface 12a of the seed layer 12. More specifically, resist liquid is applied to the seed layer 12 and the applied resist liquid is exposed and developed, so that the opening part 13x is formed. The resist layer 13 having the opening part 13x may be formed of a laminate of sheet-like resist materials (dry film resist). A photosensitive resin composition including, for example, an epoxy group resin, imide group resin, or the like can be used as a material of the resist layer 13. The resist layer 13 may have a thickness $T_5$ equal to or greater than approximately 50 µm and equal to or smaller than approximately 150 µm, for example, approximately 100 µm. In the first embodiment, in each of the semiconductor chips 20, the resist layer 13 is formed on the surface 12a of the seed layer 12 in a frame manner so as to cover only a part overlapping, in a bottom view, an external edge part of the surface (rear surface) 20b of the semiconductor chip 20. The scribe area B separating the semiconductor chips from each other is also covered with the resist layer 13. The width $W_2$ of a frame shape part of the resist layer 13 can be equal to or greater than approximately 50 µm and equal to or smaller than approximately 150 µm, for example, approximately 50 µm. It is not necessary for the entire frame shape part of the resist layer 13 to have the same fixed width.

Figure 11:
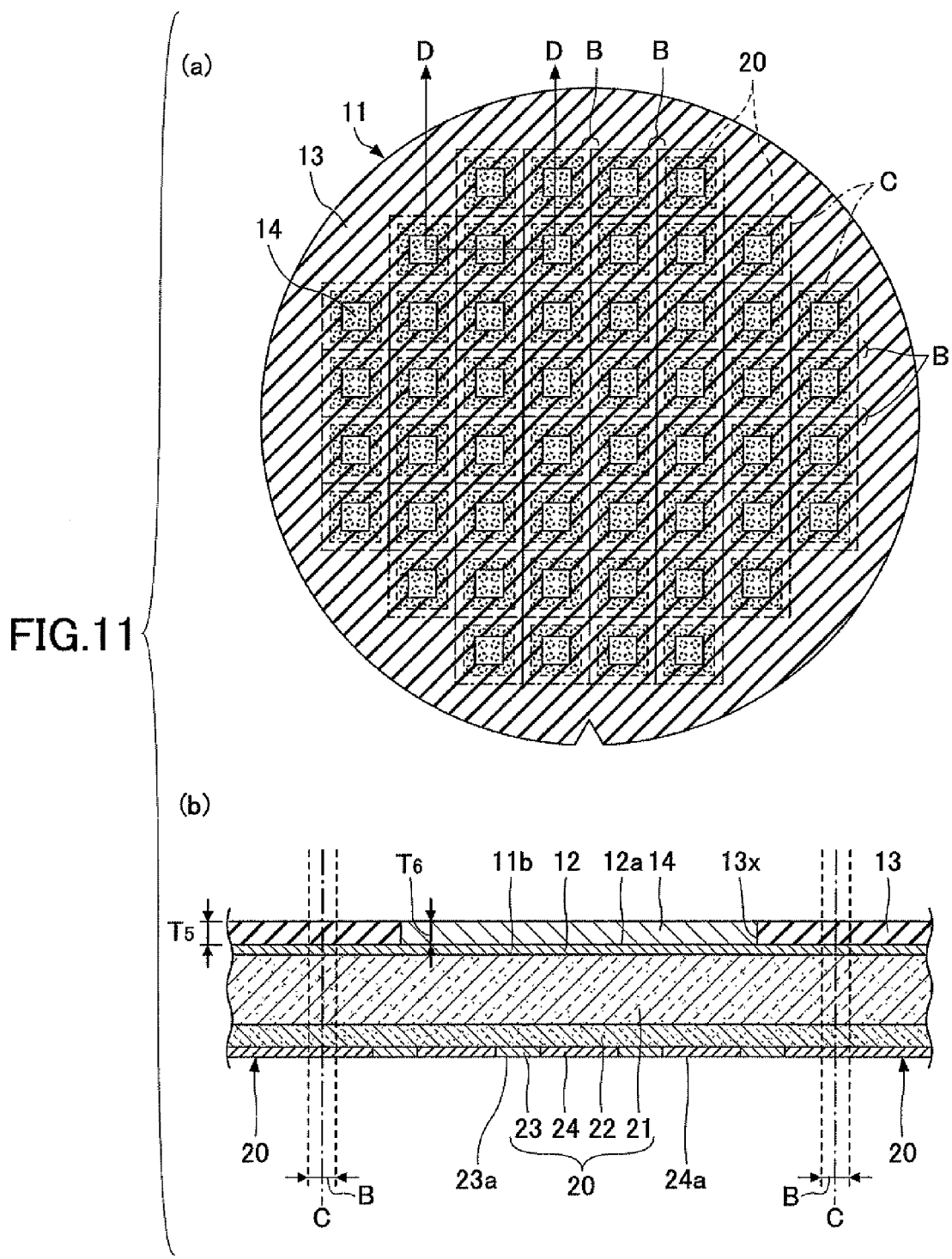
FIG. 11 is a fourth view showing a manufacturing process of the semiconductor package of the first embodiment.

Next, in a step shown in FIG. 11, by an electrolytic plating method where the seed layer is used as the power feeding layer, the metal layer 14 is formed on the surface 12a of the seed layer 12 exposed in the opening part 13x of the resist layer 13. As a material of the metal layer 14, for example, copper (Cu) or the like can be used. The thickness $T_6$ of the metal layer 14 can be substantially equal to the thickness $T_5$ of the resist layer 13, for example, approximately 50 µm through approximately 100 µm.

Figure 12:
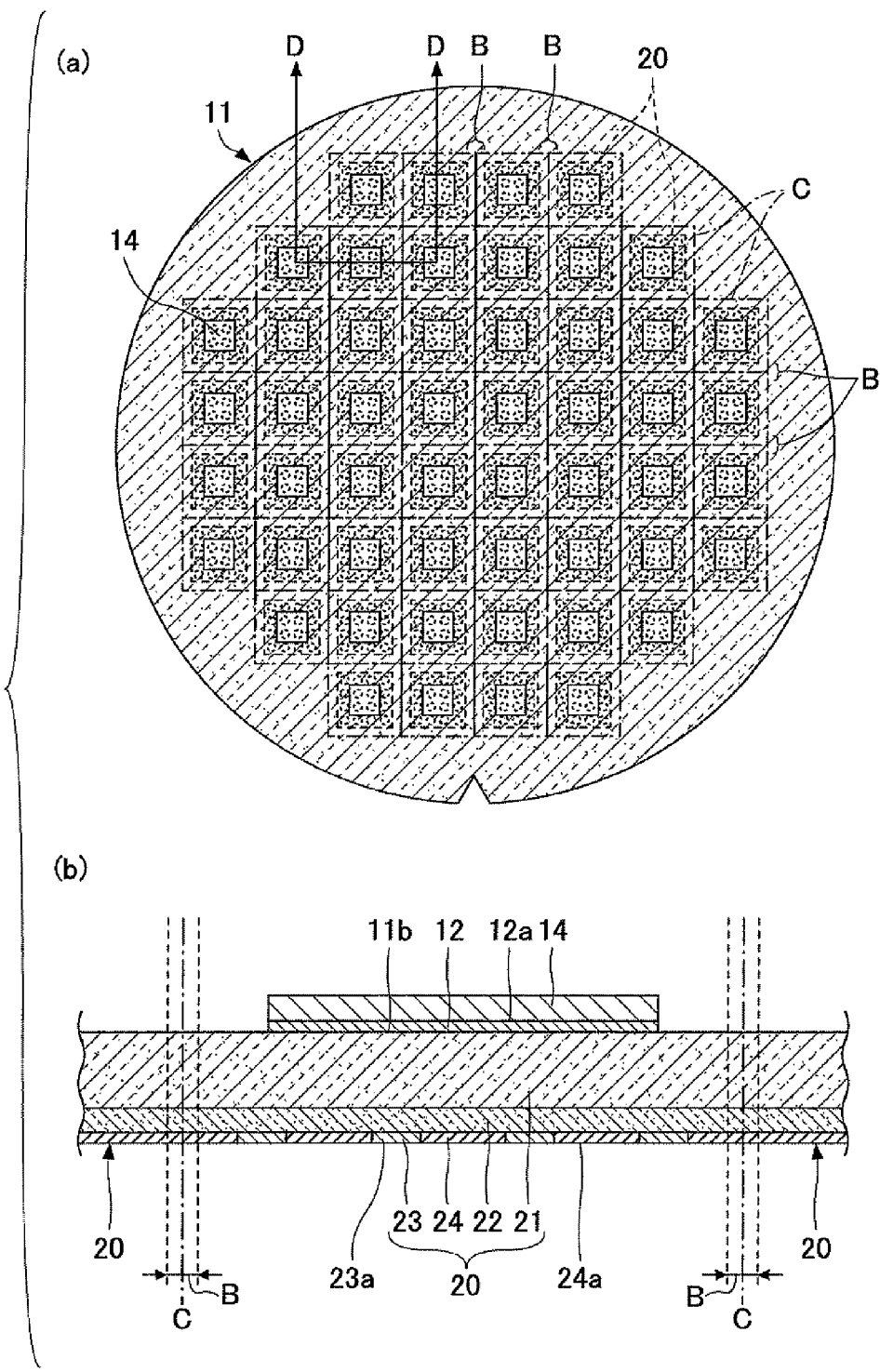
FIG. 12 is a fifth view showing a manufacturing process of the semiconductor package of the first embodiment.

Next, in a step shown in FIG. 12, the resist layer 13 shown in FIG. 11 is removed and a part of the seed layer 12 not covered with the metal layer 14 is removed. The resist layer 13 can be removed by etching using an alkaline solution such as sodium hydroxide (NaOH). The seed layer 12 not covered with the metal layer 14 can be removed by etching using, for example, a ferric chloride solution or the like.

Figure 13:
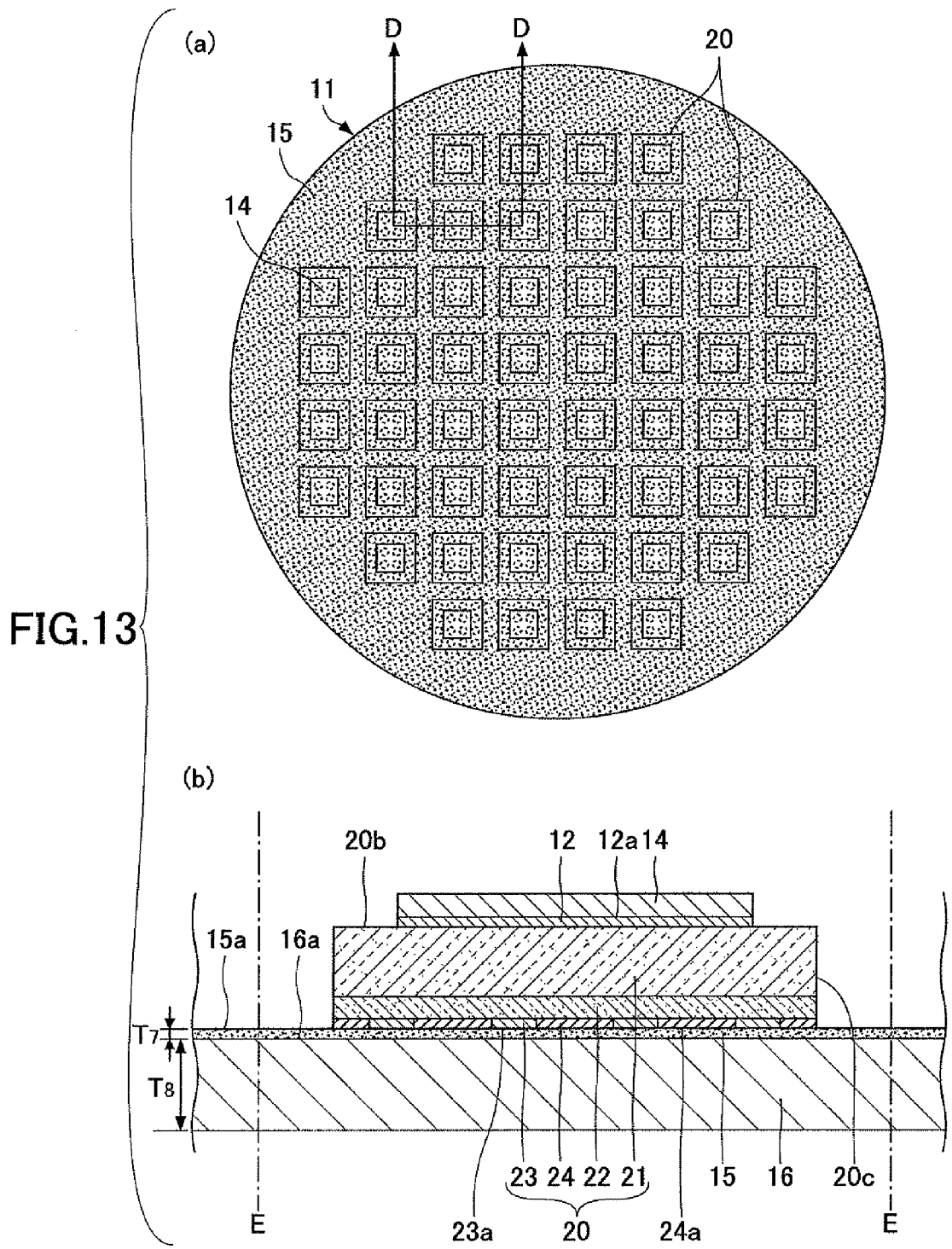
FIG. 13 is a sixth view showing a manufacturing process of the semiconductor package of the first embodiment.

Next, in a step shown in FIG. 13, the semiconductor wafer 11 shown in FIG. 12 is cut in the cutting positions C by the dicing blade or the like so that the semiconductor chips 20 are formed. Then, each of the semiconductor chips 20 where the seed layer 12 and the metal layer 14 are stacked on the surface (rear surface) 20b is provided on a surface 16a of a supporting body 16 via an adhesive member 15 so that the circuit forming surface of the semiconductor chip 20 faces a surface 15a of the adhesive member 15, and then is pressed. As a result of this, each of the semiconductor chips 20 is fixed on the surface 16a of the supporting body 16 via the adhesive member 15 in a face-down state. A gap between neighboring semiconductor chips 20 may be optional. As a material of the adhesive member 15, for example, a polyimide group resin or the like can be used. The adhesive member 15 may have thickness $T_7$ of, for example, approximately 25 µm. As a material of the supporting body 16, for example, copper (Cu) or the like can be used. The supporting body 16 may have thickness $T_8$ of, for example, approximately 200 µm. In FIG. 13, FIG. 14, and FIG. 16 through FIG. 23, a one-dotted line E indicates a position where a structural body shown in FIG. 23 is cut after the step shown in FIG. 23.

Figure 14:
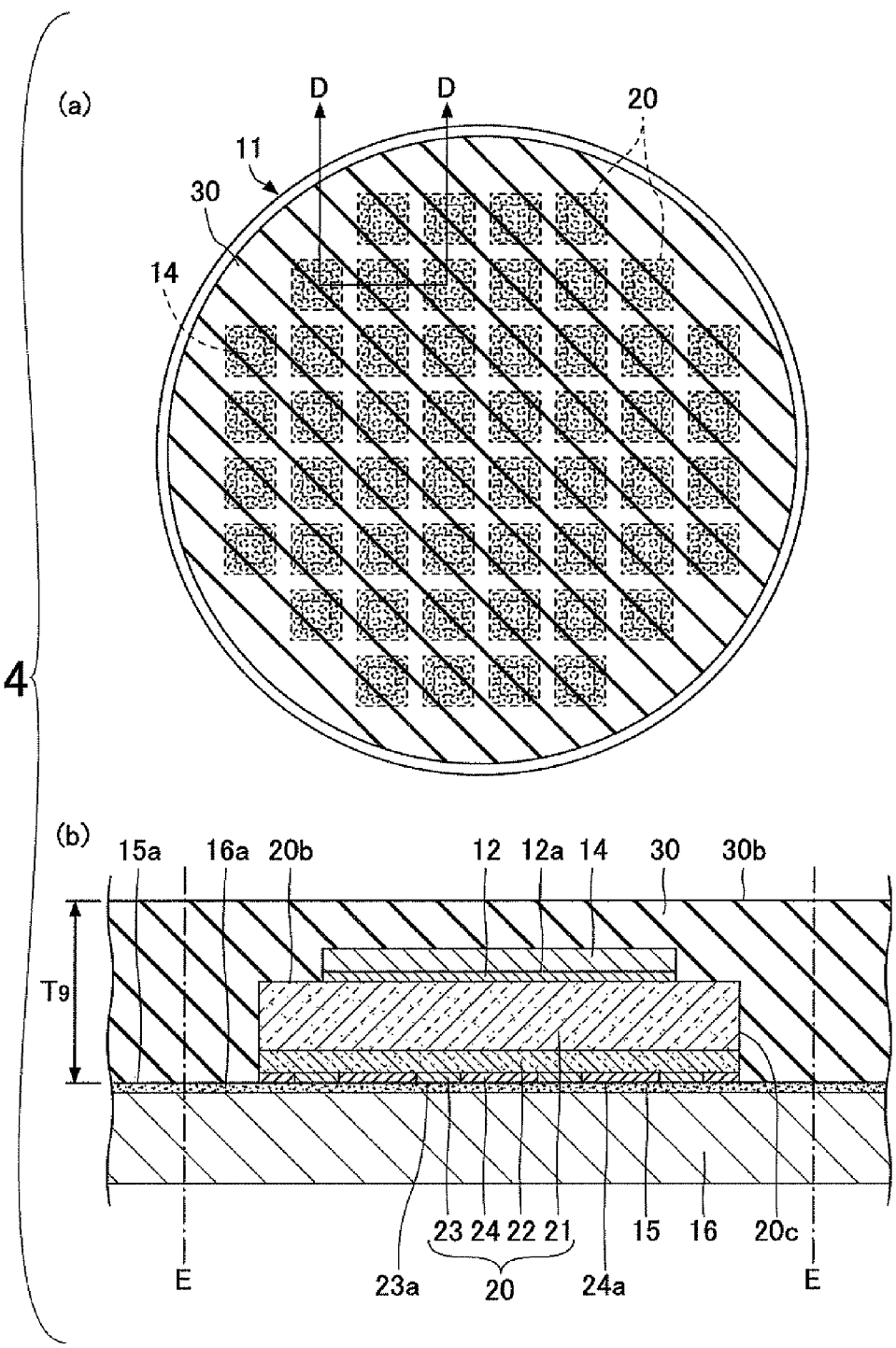
FIG. 14 is a seventh view showing a manufacturing process of the semiconductor package of the first embodiment.
Figure 15:
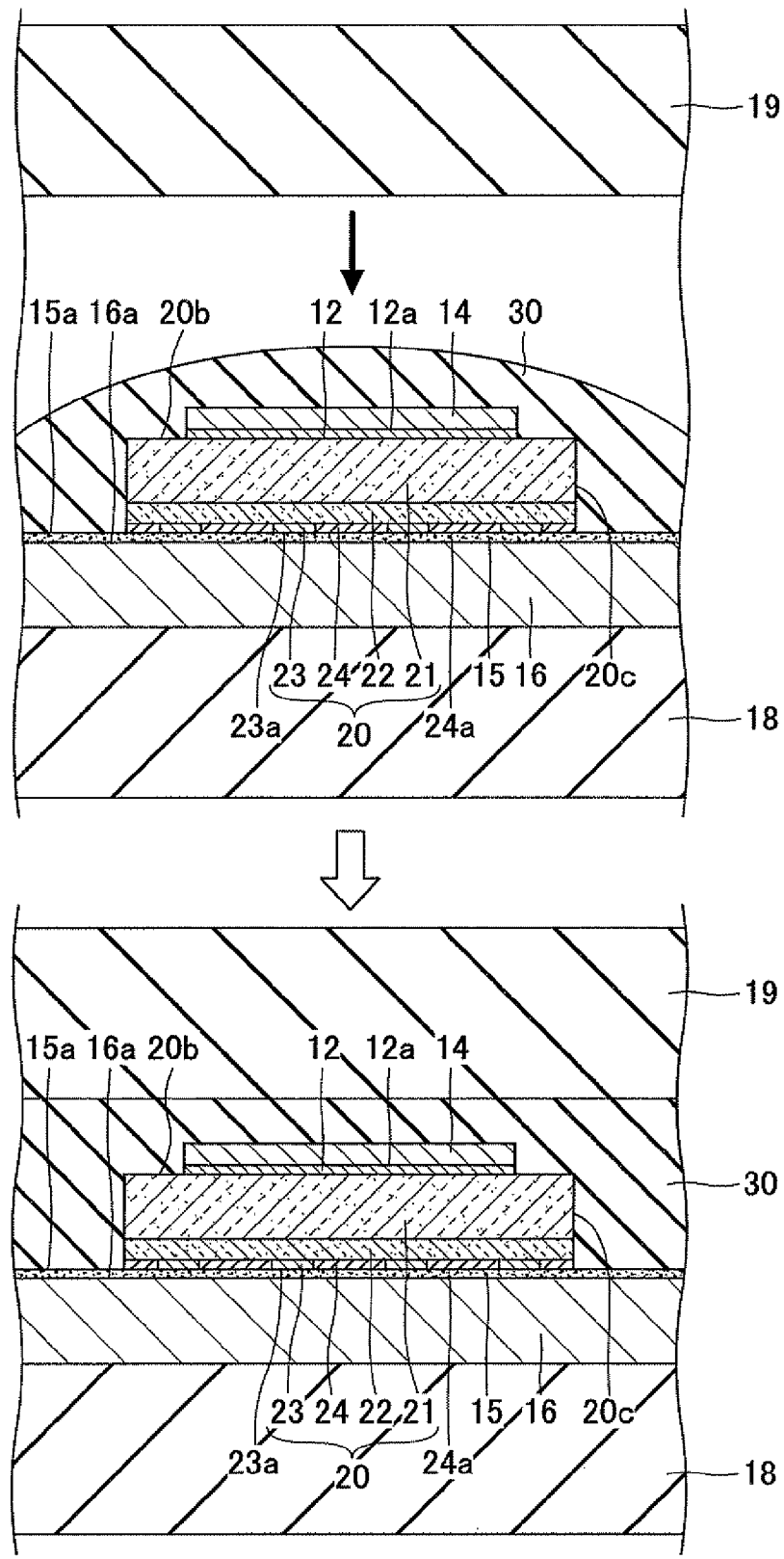
FIG. 15 is an eighth view showing a manufacturing process of the semiconductor package of the first embodiment.

Next, in a step shown in FIG. 14, the resin part 30 is formed on the surface 15a of the adhesive member 15 by a press-mold method or the like. The resin part 30 is configured to seal the seed layer 12, the metal layer 14, and the semiconductor chip 20. More specifically, as shown in FIG. 15, the structural body shown in FIG. 13 is mounted on a lower mold 18, and then the epoxy group resin or the like which is a material of the resin part 30 is applied on the surface 15a of the adhesive member 15 so as to seal the seed layer 12, the metal layer 14, and the semiconductor chip 20. After that, the epoxy group resin or the like which is a material of the resin part 30 is heated and pressed from a side opposite to the lower mold 18 by an upper mold 19. As a result of this, the epoxy group resin or the like is made uniform and cured so that the resin part 30 is formed. The heating process may be performed at the heating temperature of, for example, approximately 150° C. and for approximately five minutes. The thickness $T_9$ from the surface 15a of the adhesive member 15 to a surface 30b of the resin part 30 can be, for example, equal to or greater than approximately 900 μm.

Figure 16:
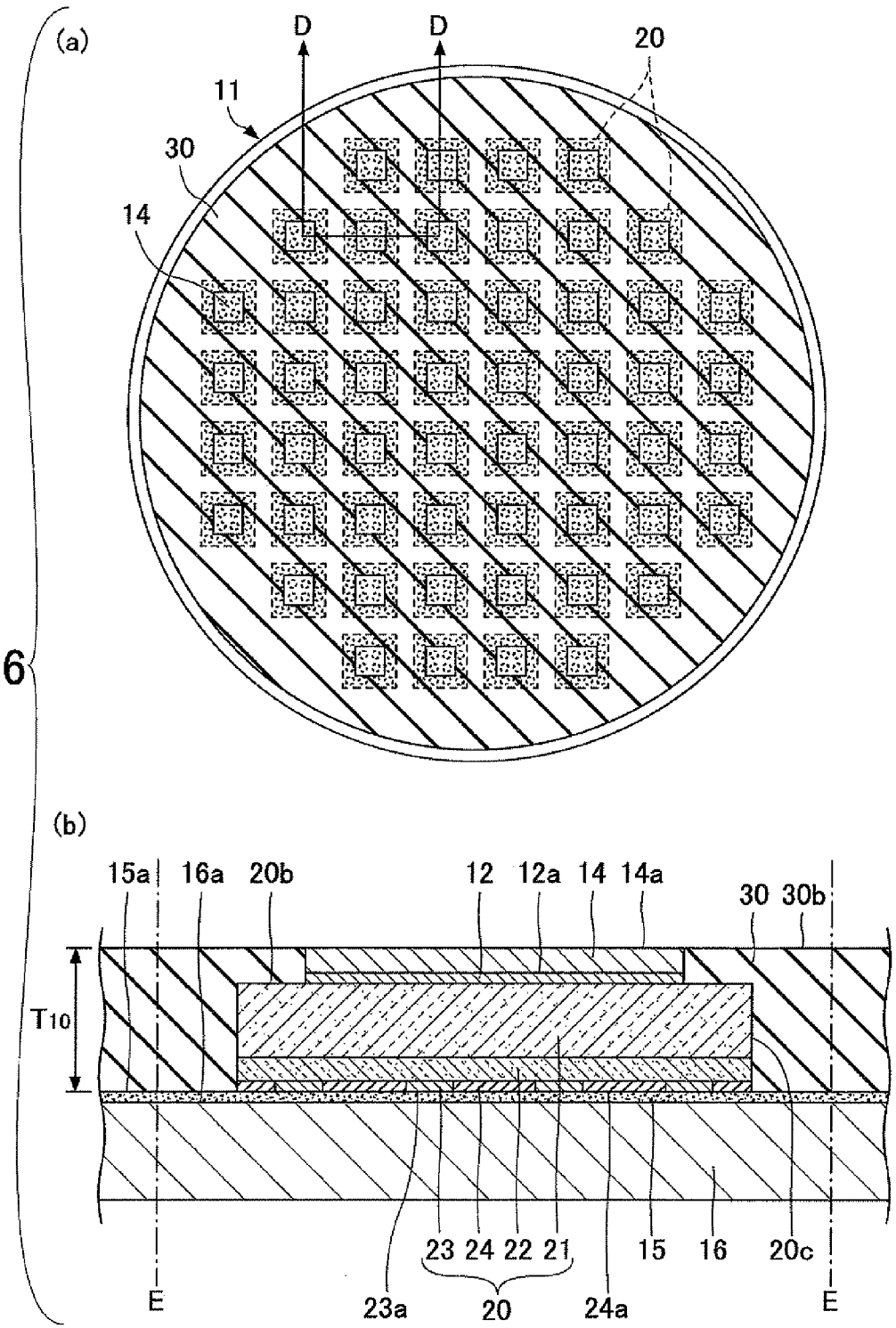
FIG. 16 is a ninth view showing a manufacturing process of the semiconductor package of the first embodiment.

Next, in a step shown in FIG. 16, the surface 30b of the resin part 30 is ground until the surface 14a of the metal layer 14 is exposed. For example, a grinder or the like can be used for grinding the resin part 30. The thickness $T_{10}$ from the surface 15a of the adhesive member 15 to the surface 30b of the resin part 30 can be, for example, approximately 900 μm.

Figure 17:
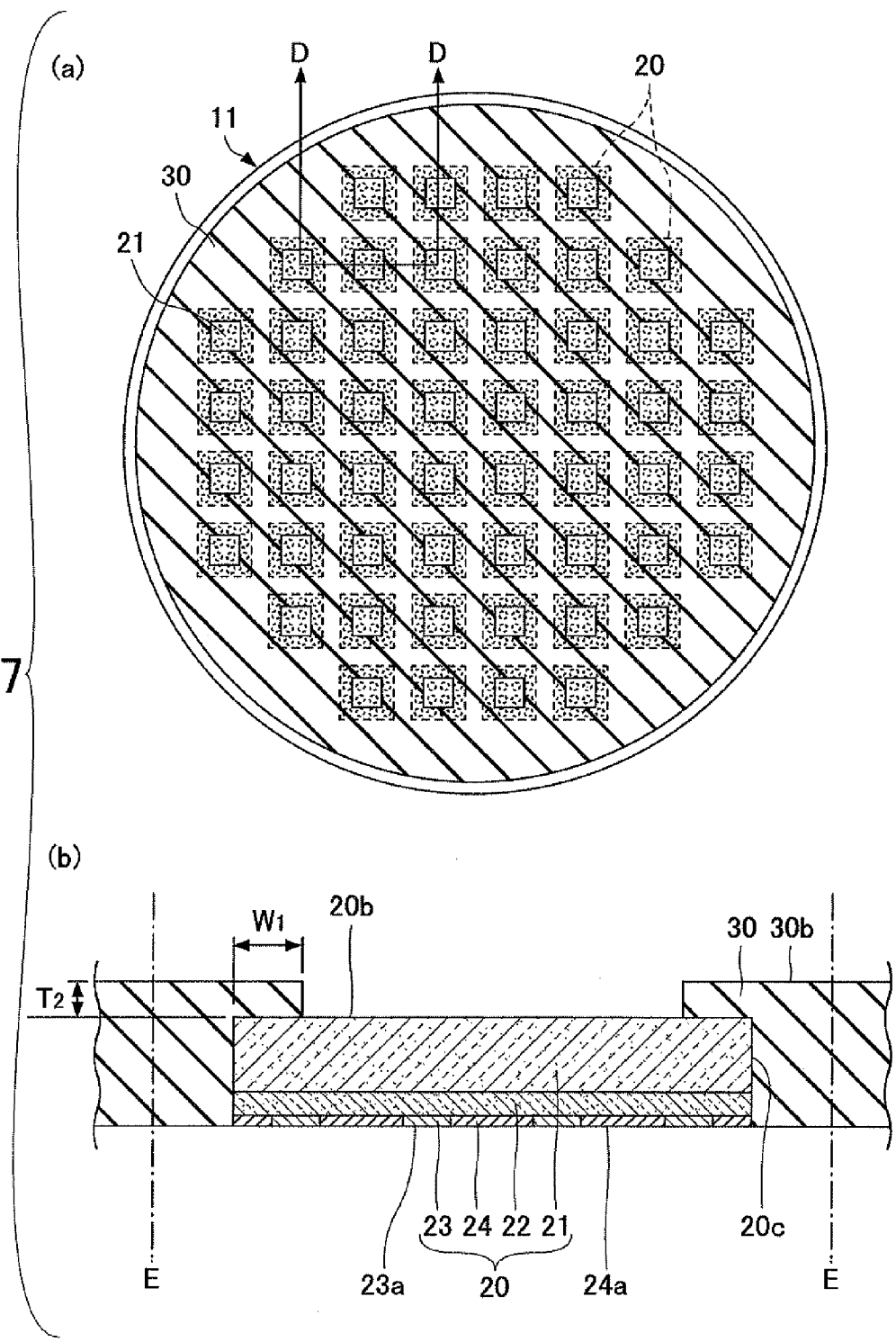
FIG. 17 is a tenth view showing a manufacturing process of the semiconductor package of the first embodiment.

Next, in a step shown in FIG. 17, the seed layer 12, the metal layer 14, the adhesive member 15, and the supporting body 16 shown in FIG. 16 are removed. The seed layer 12, the metal layer 14, and the supporting body 16 can be removed by etching using, for example, ferric chloride solution or the like. The adhesive member 15 can be mechanically peeled off after the seed layer 12, the metal layer 14, and the supporting body 16 are removed by etching. As a result of this, the resin part 30 is formed so as to cover the surface (side surface) 20c of the semiconductor chip 20 and also cover, in a frame manner, the external edge part of the surface (rear surface) 20b. As a result of this, it is possible to prevent the semiconductor chip 20 from falling down from the resin part. In addition, strength of the semiconductor package 10 can be improved when the semiconductor package 10 is eventually completed. The thickness $T_2$ of a portion of the resin part 30 which covers the external edge part of the surface (rear surface) 20b in the frame manner may be equal to or greater than approximately 50 μm and equal to or smaller than approximately 150 μm, for example, approximately 100 μm. The width W1 of the portion of the resin part 30 which covers the external edge part of the surface (rear surface) 20b in the frame manner may be equal to or greater than approximately 50 μm and equal to or smaller than approximately 150 μm, for example, approximately 50 μm. It is not necessary for this entire frame-shaped portion to have the same fixed width.

Figure 18:
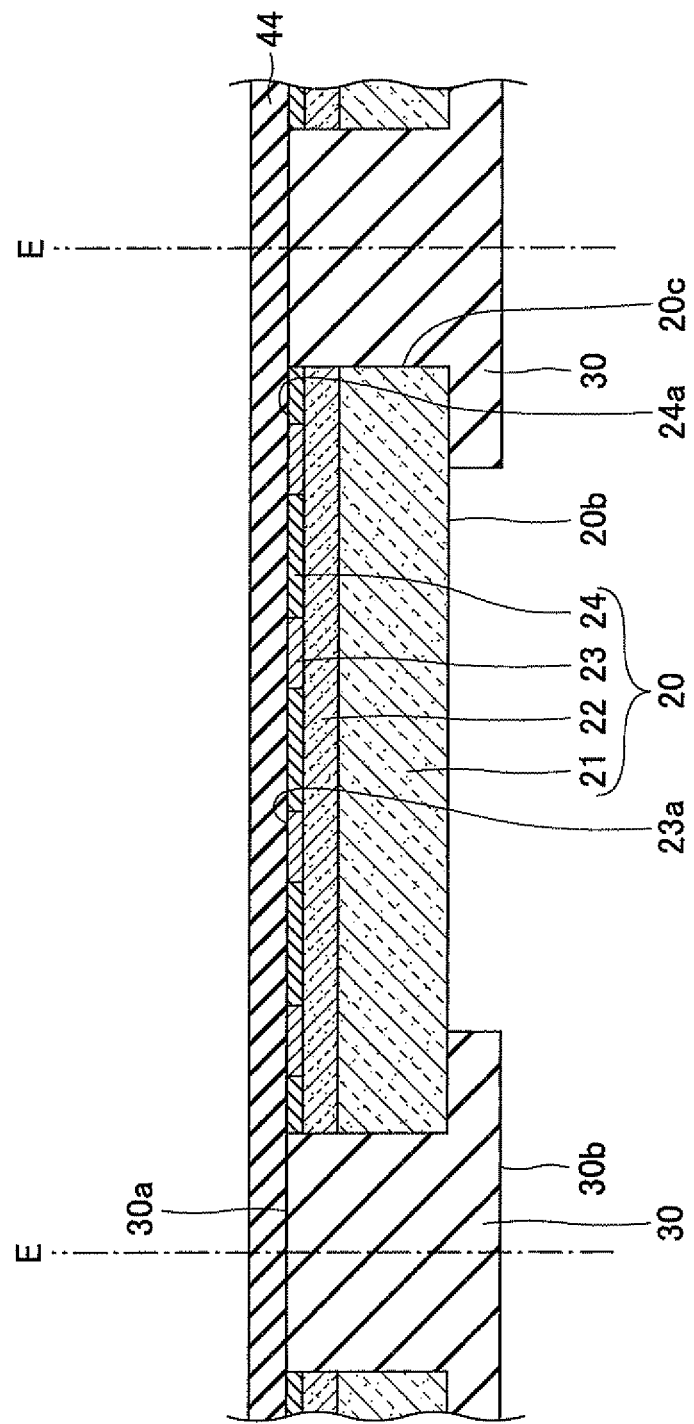
FIG. 18 is an eleventh view showing a manufacturing process of the semiconductor package of the first embodiment.

Next, in a step shown in FIG. 18, the first insulation layer 44 is formed on the surfaces 23a of the electrode pads 23, the surface 24a of the protection film 24, and the surface 30a of the resin part 30. As a material of the first insulation layer 44, resin such as epoxy group resin or polyimide group resin can be used. The first insulation layer 44 can be formed by, for example, laminating a resin film on the surfaces 23a of the electrode pads 23, the surface 24a of the protection film 24, and the surface 30a of the resin part 30, then pressing the resin film, and then applying heat at approximately 190° C. so that the resin film is cured. FIG. 18 through FIG. 23 are shown by reversing FIG. 17 in an up-side-down manner.

Figure 19:
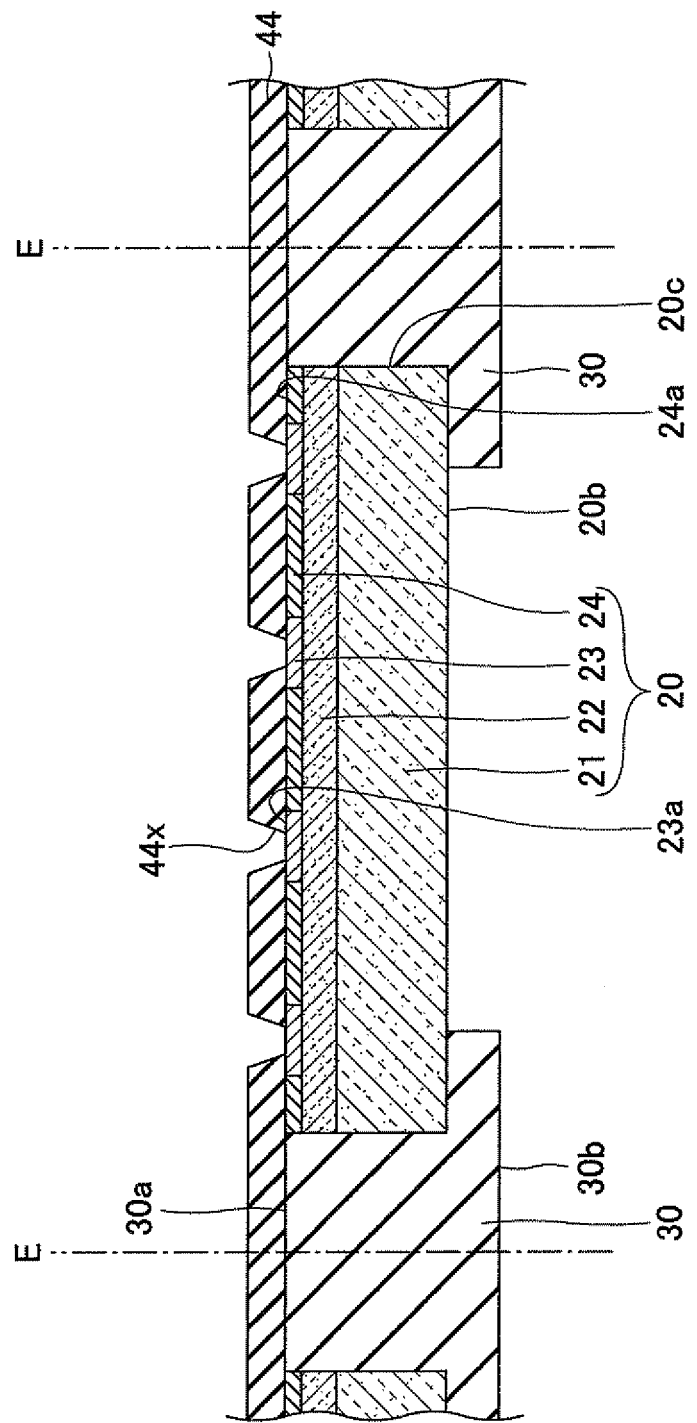
FIG. 19 is a twelfth view showing a manufacturing process of the semiconductor package of the first embodiment.

Next, in a step shown in FIG. 19, the first via holes 44x piercing the first insulation layer 44 are formed in the first insulation layer 44 by a laser process method or the like so that the electrode pads 23 are exposed. The first via holes 44x may be formed by patterning with a photolithography technique where the photosensitive resin is used as the first insulation layer 44. Alternatively, the first via holes 44x may be formed by patterning a resin film having an opening part formed by a screen printing method.

Figure 20:
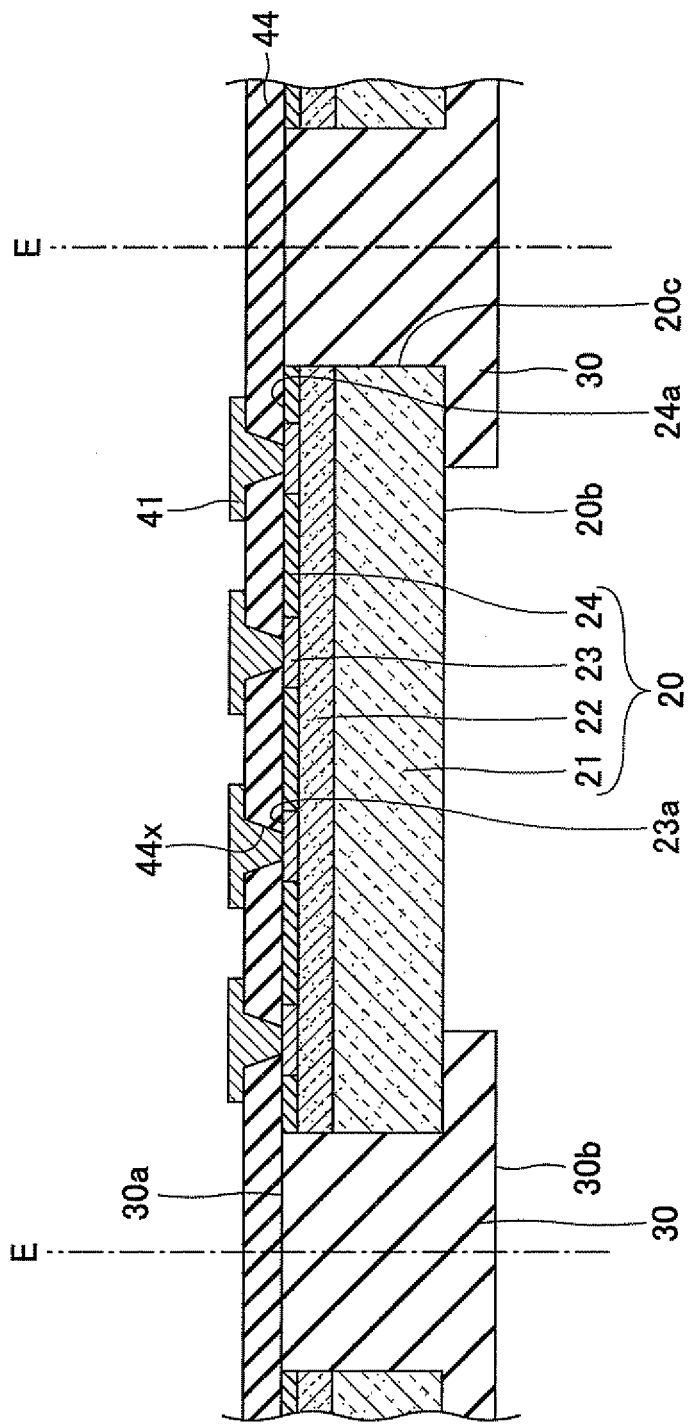
FIG. 20 is a thirteenth view showing a manufacturing process of the semiconductor package of the first embodiment.

Next, in a step shown in FIG. 20, the first wiring layer 41 is formed on the first insulation layer 44. The first wiring layer 41 is electrically connected to the electrode pads 23 exposed in the first via holes 44x. As a material of the first wiring layer 41, for example, copper (Cu) or the like can be used. The first wiring layer 41 is formed by, for example, a semi-additive process. The first wiring layer 41 includes via conductors in the first via holes 44x and a wiring pattern on the first insulation layer 44.

Details of forming the first wiring layer 41 by the semi-additive process are as follows. First, a Cu seed layer (not illustrated) is formed on internal walls of the first via holes 44x and the first insulation layer 44 by an electroless plating method or a sputtering method. After that, a resist layer (not illustrated) having an opening part corresponding to the first wiring layer 41 is formed on this Cu seed layer (not illustrated). Next, a Cu pattern (not illustrated) is formed in the opening part of the resist layer by an electrolytic plating method where the Cu seed layer is used as a power feeding layer.

Next, after the resist layer is removed, the first wiring layer 41 is formed by etching the Cu seed layer where the Cu layer pattern is used as a mask. As a forming method of the first wiring layer 41, various kinds of wiring forming methods such as a subtractive process, in addition to the above-mentioned semi-additive process, can be used.

Figure 21:
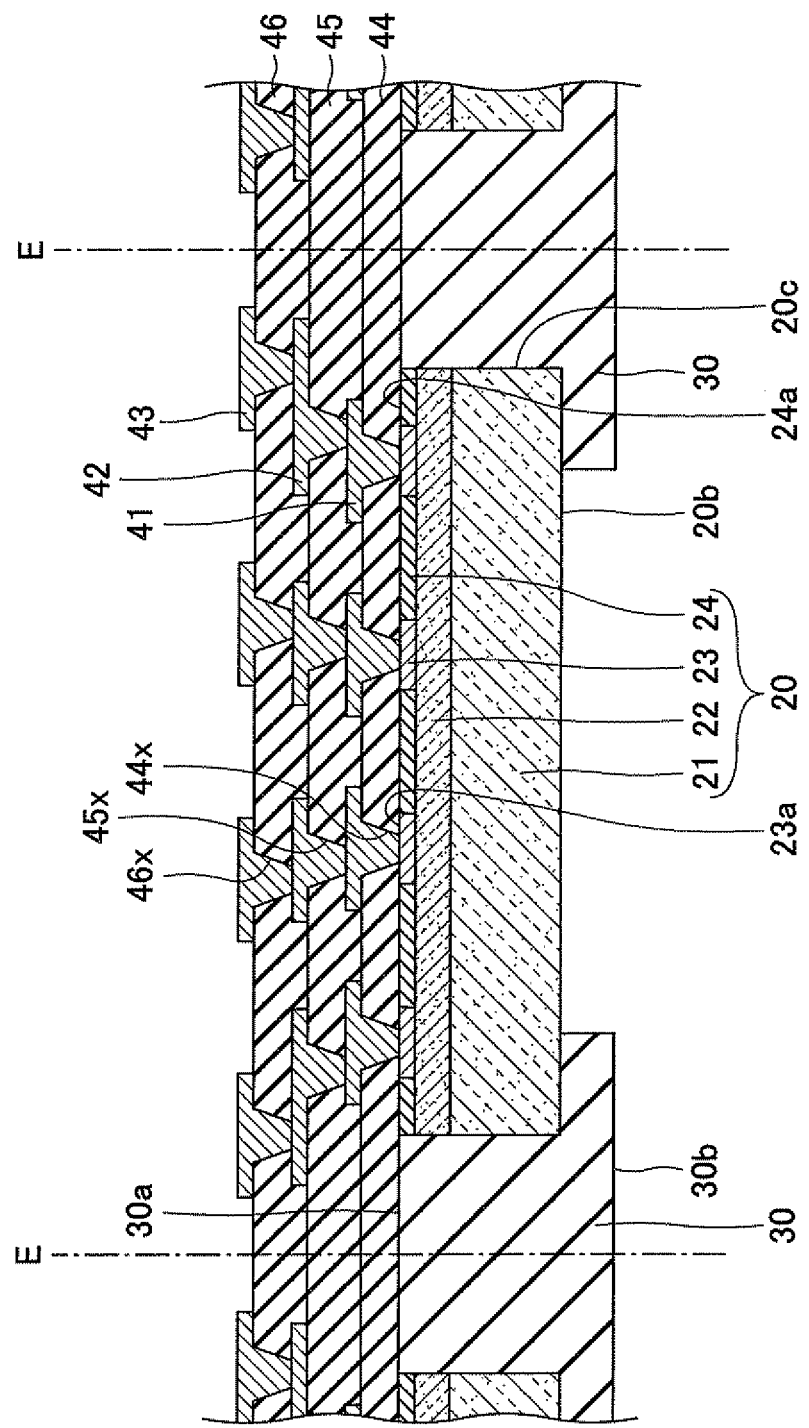
FIG. 21 is a fourteenth view showing a manufacturing process of the semiconductor package of the first embodiment.

Next, in a step shown in FIG. 21, by repeating the substantially same processes, the first wiring layer 41 through the third wiring layer 43 and the first insulation layer 44 through the third insulation layer 46 are stacked. In other words, after the second insulation layer 45 covering the first wiring layer 41 is formed, the second via holes 45x are formed in the second insulation layer 45 on the first wiring layer 41.

The second wiring layer 42 is formed on the second insulation layer 45. The second wiring layer 42 is connected to the first wiring layer 41 via the second via holes 45x. As a material of the second wiring layer 42, for example, copper (Cu) or the like can be used. The second wiring layer 42 is formed by, for example, a semi-additive process.

In addition, after the third insulation layer 46 covering the second wiring layer 42 is formed, the third via holes 46x are formed in the third insulation layer 46 on the second wiring layer 42. Furthermore, the third wiring layer 43 connected to the second wiring layer 42 via the third via holes 46x is formed on the third insulation layer 46. As a material of the third wiring layer 43, for example, copper (Cu) or the like can be used. The third wiring layer 43 is formed by, for example, a semi-additive process.

Thus, a built-up wiring layer is formed on the surfaces 23a of the electrode pads 23, the surface 24a of the protection film 24, and the surface 30a of the resin part 30. Although the built-up wiring layer is formed by three layers (the first wiring layer 41 through the third wiring layer 43) in this embodiment, a built-up wiring layer of n (n is an integer equal to or greater than 1) layers may be formed.

Figure 22:
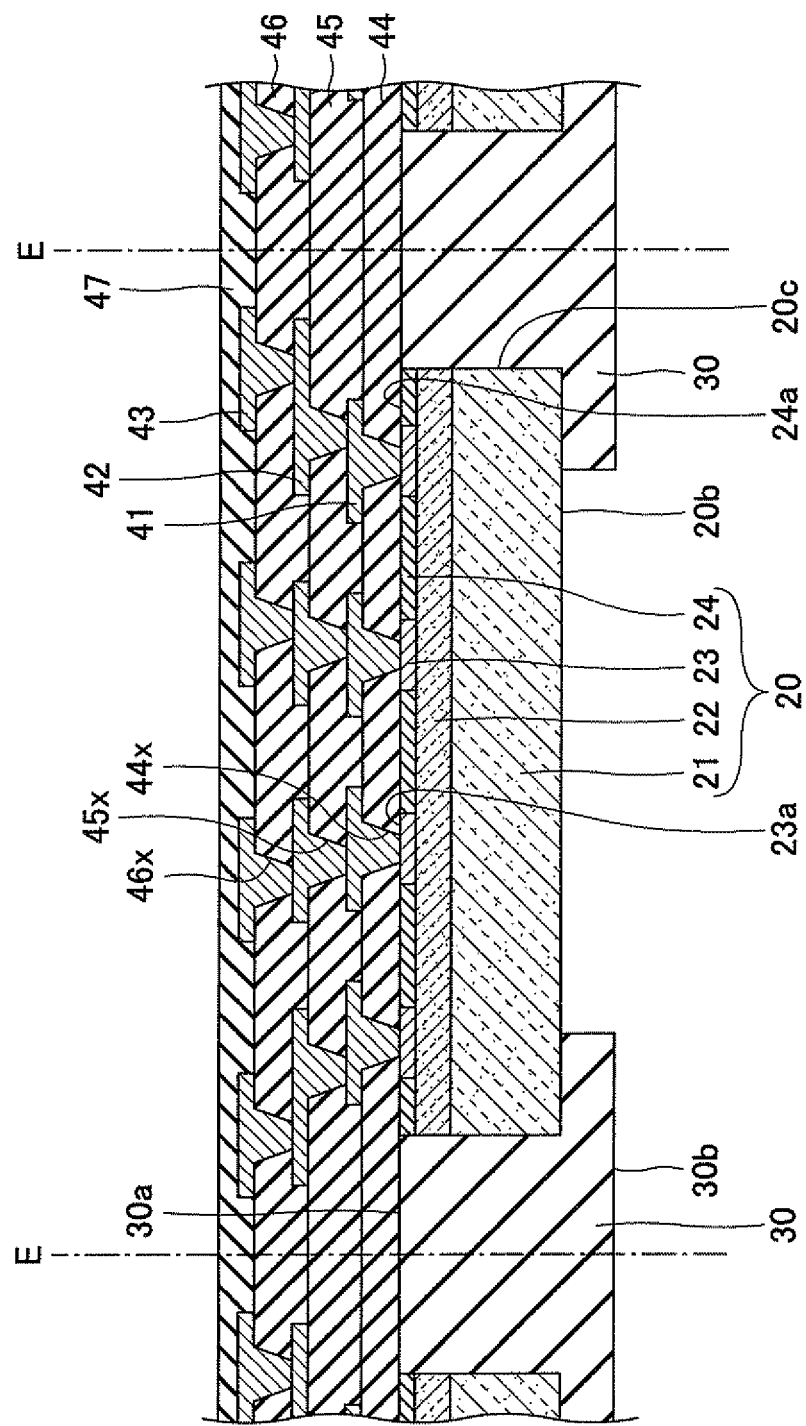
FIG. 22 is a fifteenth view showing a manufacturing process of the semiconductor package of the first embodiment.
Figure 23:
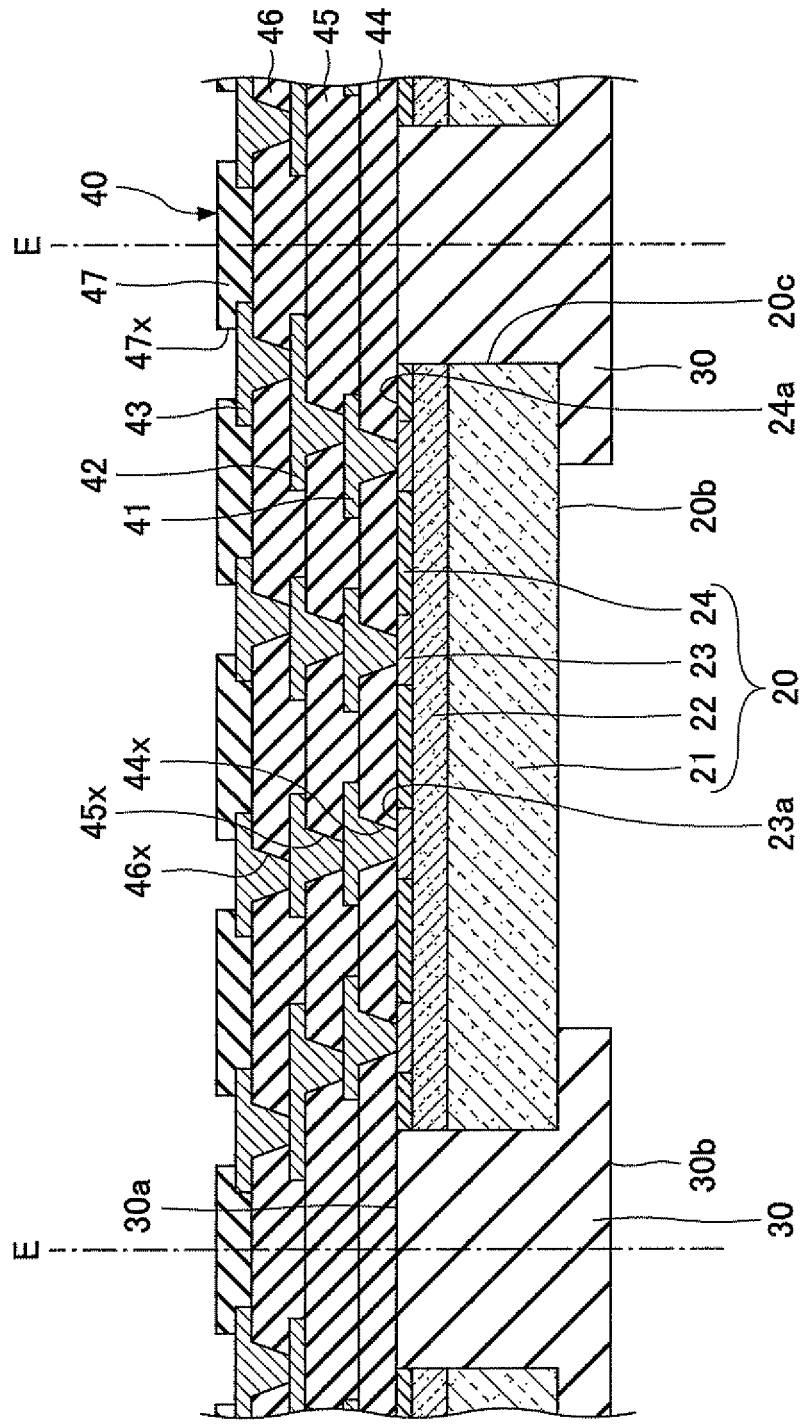
FIG. 23 is a sixteenth view showing a manufacturing process of the semiconductor package of the first embodiment.

Next, in a step shown in FIG. 22, solder resist is applied on the third insulation layer 46 so as to cover the third wiring layer 43 so that the solder resist layer 47 is formed. As a material of the solder resist layer 47, for example, a photo-sensitive resin composition including, for example, an epoxy group resin, imide group resin, or the like can be used.

Next, in a step shown in FIG. 23, the solder resist layer 47 is exposed and developed so that the opening parts 47x are formed. As a result of this, a part of the third wiring layer 43 is exposed in the opening parts 47x of the solder resist layer 47. The third wiring layer 43 exposed in the opening parts 47x of the solder resist layer 47 functions as electrode pads connected to a motherboard and others.

A metal layer may be formed on the third wiring layer 43 exposed in the opening parts 47x of the solder resist layer 47. As an example of the metal layer, an Au layer, a Ni/Au layer where a Ni layer and the Au layer are stacked in this order, a Ni/Pd/Au layer where the Ni layer, a Pd layer, and the Au layer are stacked in this order, or the like may be applied. In addition, instead of providing the metal layer, an OSP (Organic Solderability Preservative) process may be applied onto the third wiring layer 43 exposed in the opening parts 47x of the solder resist layer 47.

After the step shown in FIG. 23, the structural body shown in FIG. 23 is cut in the positions indicated by one-dotted lines E so that the semiconductor package 10 shown in FIG. 7 is completed.

According to the first embodiment, in the semiconductor package, the wiring structure is formed on the circuit forming surface of the semiconductor chip and the surface of the resin part being situated at the same side as the circuit forming surface in a state where the semiconductor chip and the resin part configured to cover the surface (side surface) of the semiconductor chip are a base body. The resin part is further formed so as to cover the external edge part of the rear surface of the semiconductor chip in a frame manner. Because of this, a part of the rear surface of the semiconductor chip is covered with the resin part. Another part of the rear surface of the semiconductor chip is exposed from the resin part. As a result of this, it is possible to prevent the semiconductor chip from falling down from the resin part without obstructing transfer of the heat generated by the semiconductor chip. In addition, it is possible to improve the strength of the semiconductor package.

Modified Example of the First Embodiment

In the semiconductor package 10 of the first embodiment, the resin part configured to cover the side surface 20c of the semiconductor chip 20 is further formed so as to cover the external edge part of the rear surface 20b of the semiconductor chip 20 in a frame manner. However, it is not always necessary to form the resin part 30 on the rear surface 20b of the semiconductor chip 20 in a frame manner. In a modified example of the first embodiment, the resin part 30 is formed on the rear surface 20b of the semiconductor chip 20 in a different manner (having a configuration other than a frame shape).

Figure 24:
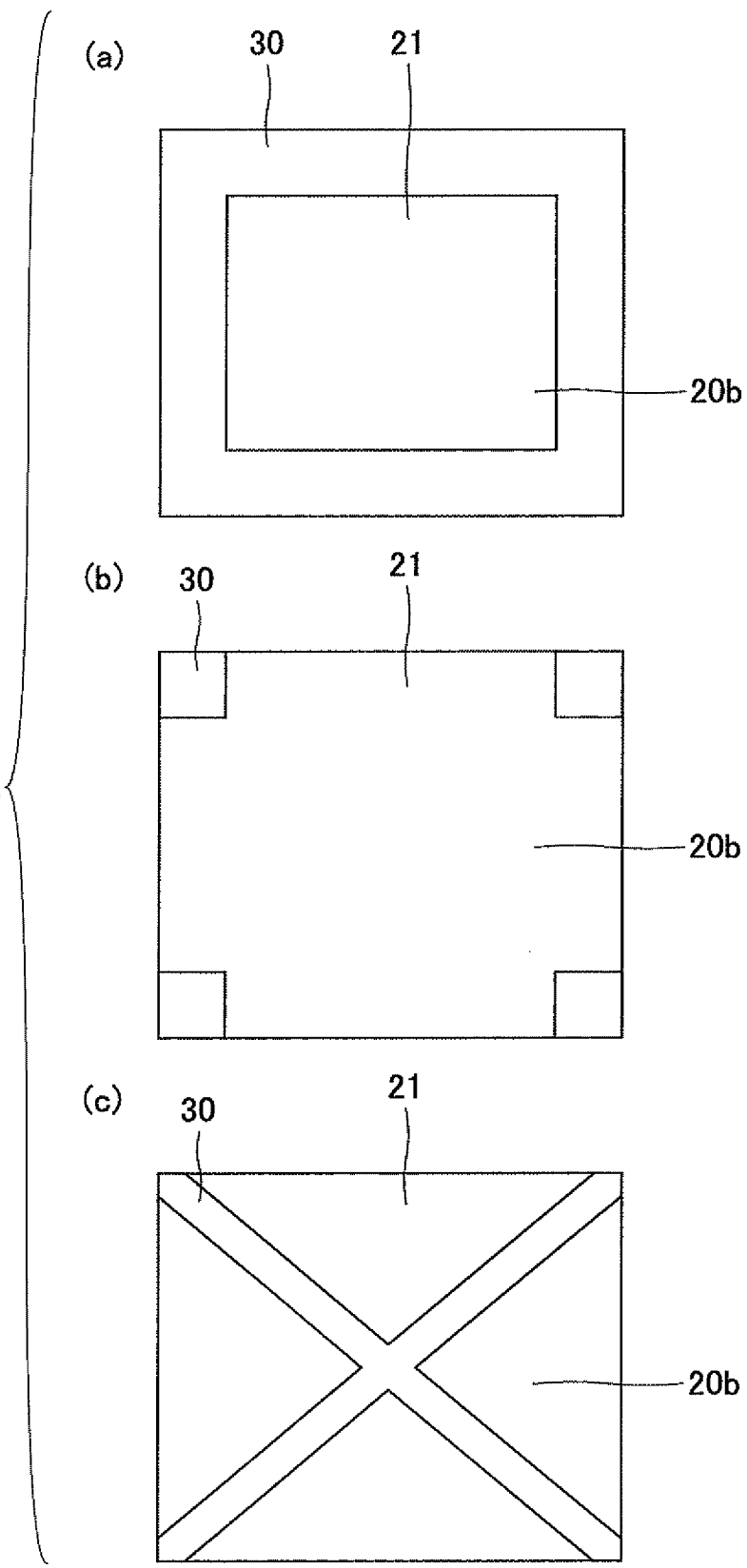
FIG. 24 is a bottom view showing a configuration of a resin part formed at a rear surface of a semiconductor chip.

FIG. 24 is a bottom view showing an example of configurations of the resin part formed on the rear surface of the semiconductor chip. In FIG. 24, (a) shows, in an expanded manner, one of the semiconductor chips 20 shown in (a) of FIG. 17. In other words, (a) in FIG. 17 shows the example of the first embodiment where the resin part 30 is formed on the rear surface 20b of the semiconductor chip 20 in a frame manner. In FIG. 24, (b) and (c) show modified examples of the first embodiment where the resin part 30 is formed on the rear surface 20b of the semiconductor chip 20 in different manners (having a configuration other than a frame shape). The resin part 30 formed on the rear surface 20b of the semiconductor chip 20 may have a configuration shown in (b) or (c) of FIG. 24 instead of the configuration (frame shape) shown in (a) of FIG. 24.

In the example shown in (b) of FIG. 24, the resin part 30 is formed so as to cover four corners of the rear surface 20b of the semiconductor chip 20. In the example shown in (b) of FIG. 24 compared to the example shown in (a) of FIG. 24, an exposed area of the rear surface 20b of the semiconductor chip 20 is larger and therefore it is advantageous for radiation of heat generated by the semiconductor chip 20. In addition, it is possible to easily attach a component such as a heat spreader to the rear surface 20b of the semiconductor chip 20 for the purpose of the radiation of heat generated by the semiconductor chip 20. On the other hand, the example shown in (a) of FIG. 24 has more advantages than the example shown in (b) of FIG. 24 regarding improvement of the strength of the semiconductor package 10.

In the example shown in (c) of FIG. 24, the resin part 30 is formed on the rear surface 20b of the semiconductor chip 20 in a diagonal manner. In the example shown in (c) of FIG. 24 compared to the example shown in (a) of FIG. 24, an exposed area of the rear surface 20b of the semiconductor chip 20 is larger and therefore it is advantageous for radiation of heat generated by the semiconductor chip 20. In addition, it is also advantageous to improve the strength of the semiconductor package 10. On the other hand, the example shown in (a) of FIG. 24 has more advantages than the example shown in (c) of FIG. 24 in that it is possible to easily attach a component such as a heat spreader to the rear surface 20b of the semiconductor chip 20 for the purpose of the radiation of heat generated by the semiconductor chip 20 in the example shown in (a) of FIG. 24.

According to the modified examples of the first embodiment, it is possible to achieve the effect same as that achieved by the first embodiment and also achieve the following effect. That is, it is possible to achieve heat radiation or easy mounting of the component by properly selecting the configuration of the resin part formed in the rear surface of the semiconductor chip.

The configurations of the resin part shown in FIG. 24 are just examples. The configuration of the resin part formed in the rear surface of the semiconductor chip is not limited to the configurations shown in FIG. 24. The configuration of the resin part formed in the rear surface of the semiconductor chip may be a configuration where a part of the rear surface of the semiconductor chip is covered and another part of the rear surface of the semiconductor chip is exposed.

Second Embodiment

In the second embodiment, the semiconductor chip where a bump or a post is formed on an electrode pad is formed and the semiconductor chip is mounted on a supporting body in a face-up manner (where the bump faces upward). In the second embodiment, explanation of portions that are the same as portions discussed in the first embodiment is omitted and portions that are different from the portions discussed in the first embodiment are mainly discussed. The reason why the semiconductor chip is mounted on a supporting body in a face-up manner (where the bump faces upward) is as follows. If the semiconductor chip where the bump is formed on the electrode pad is mounted on a supporting body in a face-down manner (where the bump faces downward), the resin flows in a gap between the bump and the supporting body so that the resin may cover the bump surface.

[Structure of the Semiconductor Package of the Second Embodiment]

Figure 25:
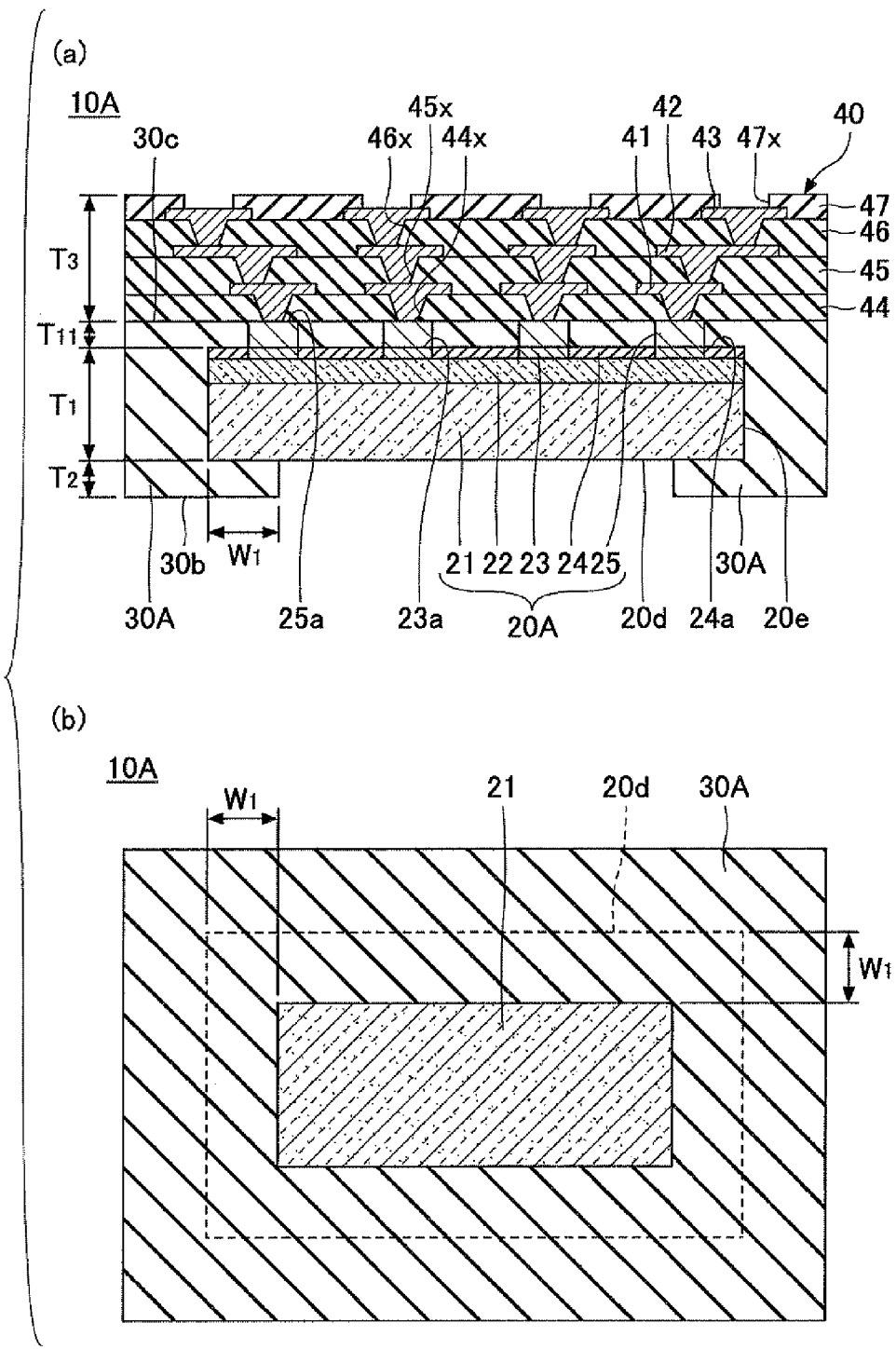
FIG. 25 is a view showing a semiconductor package of a second embodiment of the present invention.

FIG. 25 is a view showing the semiconductor package of the second embodiment of the present invention. More specifically, (a) in FIG. 25) is a cross-sectional view and (b) in FIG. 25 is a bottom view. As shown in FIG. 25, a semiconductor package 10A is different from the semiconductor package shown in FIG. 7 in that the semiconductor chip 20 and the resin part 30 are replaced with a semiconductor chip 20A and a resin part 30A. In the following explanation, explanation of portions of the semiconductor package 10A that are the same as portions of the semiconductor package 10 is omitted and portions of the semiconductor package 10A that are different from the portions of the semiconductor package 10 are mainly discussed.

The semiconductor chip 20A has the same structure as that of the semiconductor chip 20 except that the bumps 25 are formed on the surfaces 23a of the electrode pads 23 of the semiconductor chip 20A. As the bump 25, for example, a gold (Au) bump, a solder bump, a copper (Cu) bump, or the like can be used. The bump 25 may be formed in a pillar shape. A thickness $T_{11}$ of the bump 25 can be equal to or greater than approximately 20 μm and equal to or less than approximately 50 μm, for example, approximately 30 μm. In the following explanation, a surface of the semiconductor chip 20A where the electrode pads 23 and the bumps 25 are formed may be called a circuit forming surface.

The resin part 30A is formed so as to cover a surface (side surface) 20e of the semiconductor chip 20A and cover an external edge part of the surface (rear surface) 20d in a frame manner. The resin part 30A is formed so as to cover the surface 24a of the protection film 24 of the semiconductor chip 20A. In the semiconductor chip 20A, the surface (rear surface) 20d is a surface situated at a side opposite to the circuit forming surface. The surface 30c of the resin part 30A is substantially flush with surfaces (upper end surfaces) 25a of the bumps 25 of the semiconductor chip 20A. A thickness $T_2$ of a portion of the resin part 30A which covers the external edge part of the surface (rear surface) 20d of the semiconductor chip 20A in the frame manner may be equal to or greater than approximately 50 μm and equal to or smaller than approximately 150 μm, for example, approximately 100 μm. A width W1 of a portion of the resin part 30A which covers the external edge part of the surface (rear surface) 20d of the semiconductor chip 20A in the frame manner may be equal to or greater than approximately 50 μm and equal to or smaller than approximately 150 μm, for example, approximately 50 μm. It is not necessary for this entire frame-shaped portion to have the same constant width.

A thickness of a portion of the resin part 30A covering the surface 24a of the protection film 24 is substantially equal to the thickness $T_{11}$ of the bumps 25 and is relatively thin (for example, approximately 30 μm). Accordingly, it is not sufficient by only this part to achieve the strength of the semiconductor package 10A. On the other hand, the part of the resin part 30A covering the external edge part of the surface (rear surface) 20d of the semiconductor chip 20A in the frame manner is relatively thick (for example, approximately 100 μm). Accordingly, it is possible, by this part, to achieve the strength of the semiconductor package 10A.

In the wiring structure 40, the first insulation layer 44 is formed on the surfaces 25a of the bumps 25 and the surface 30c of the resin part 30A of the semiconductor chip 20A. The first wiring layer 41 is formed on the first insulation layer 44. The first wiring layer 41 is electrically connected to the bumps 25 of the semiconductor chip 20A via the first via holes 44x piercing the first insulation layer 44. A thickness $T_3$ of the wiring structure 40 may be, for example, equal to or greater than approximately 50 μm and equal to or smaller than approximately 100 μm, for example, approximately 50 μm. In other words, the thickness $T_3$ of the wiring structure 40 (equal to or greater than approximately 50 μm and equal to or smaller than approximately 100 μm) is extremely less than the thickness $T_1$ of the semiconductor chip 20 (equal to or greater than approximately 100 μm and equal to or smaller than approximately 800 μm).

Thus, in the semiconductor package 10A, the wiring structure 40 is formed on the circuit forming surface of the semiconductor chip 20A and the surface 30c of the resin part 30A being situated at the same side as the circuit forming surface in a state where the semiconductor chip 20A and the resin part 30A configured to cover the surface (side surface) 20e of the semiconductor chip 20A are a base body. The resin part 30A is further formed so as to cover the external edge part of the surface (rear surface) 20d of the semiconductor chip 20A in a frame manner. Because of this, a part of the surface (rear surface) 20d of the semiconductor chip 20A is covered with the resin part 30A. Another part of the surface (rear surface) 20d of the semiconductor chip 20A is exposed from the resin part 30A. As a result of this, it is possible to prevent the semiconductor chip 20A from falling down from the resin part 30A without obstructing the transfer of the heat generated by the semiconductor chip 20A. In addition, it is possible to improve the strength of the semiconductor package 10A.

[Manufacturing Method of Semiconductor Package of the Second Embodiment]

Next, a manufacturing method of a semiconductor package of the second embodiment of the present invention is discussed. FIG. 26 through FIG. 30 are views showing a manufacturing process of the semiconductor package of the second embodiment. In FIG. 26 through FIG. 30, parts that are the same as the parts shown in FIG. 25 are given the same reference numerals, and explanation thereof is omitted.

Figure 26:
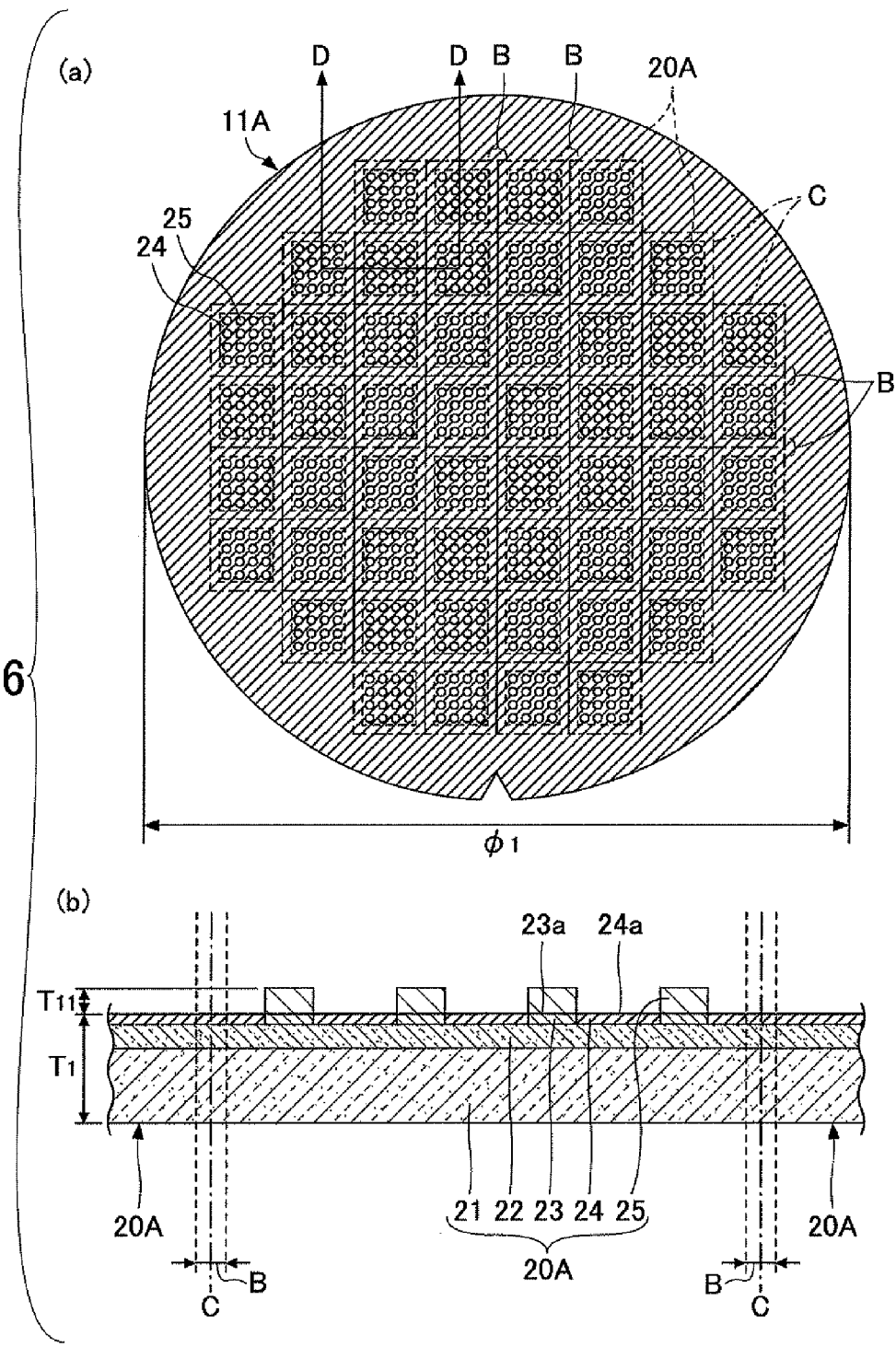
FIG. 26 is a first view showing a manufacturing process of the semiconductor package of the second embodiment.

First, in a step shown in FIG. 26, a semiconductor wafer 11A having plural semiconductor chips 20A is provided. In the semiconductor wafer 11A, scribe regions B are where the semiconductor chips 20A are to be separated from each other. Cutting positions C are where the semiconductor wafer 11A is to be cut by a dicing blade or the like. A diameter $\phi_1$ of the semiconductor wafer 11A may be, for example, approximately 200 mm. The semiconductor wafer 11A may have a thickness $T_1$ equal to or greater than approximately 100 μm and equal to or smaller than approximately 800 μm, for example, approximately 800 μm.

The semiconductor chip 20A has the same structure as that of the semiconductor chip 20 except that the bumps 25 are formed on the surfaces 23a of the electrode pads 23 of the semiconductor chip 20A. As the bump 25, for example, a gold (Au) bump, a solder bump, a copper (Cu) bump, or the like can be used. The bump 25 may be formed in a pillar shape. A thickness $T_{11}$ of the bump 25 can be equal to or greater than approximately 20 μm and equal to or less than approximately 50 μm, for example, approximately 30 μm.

Figure 27:
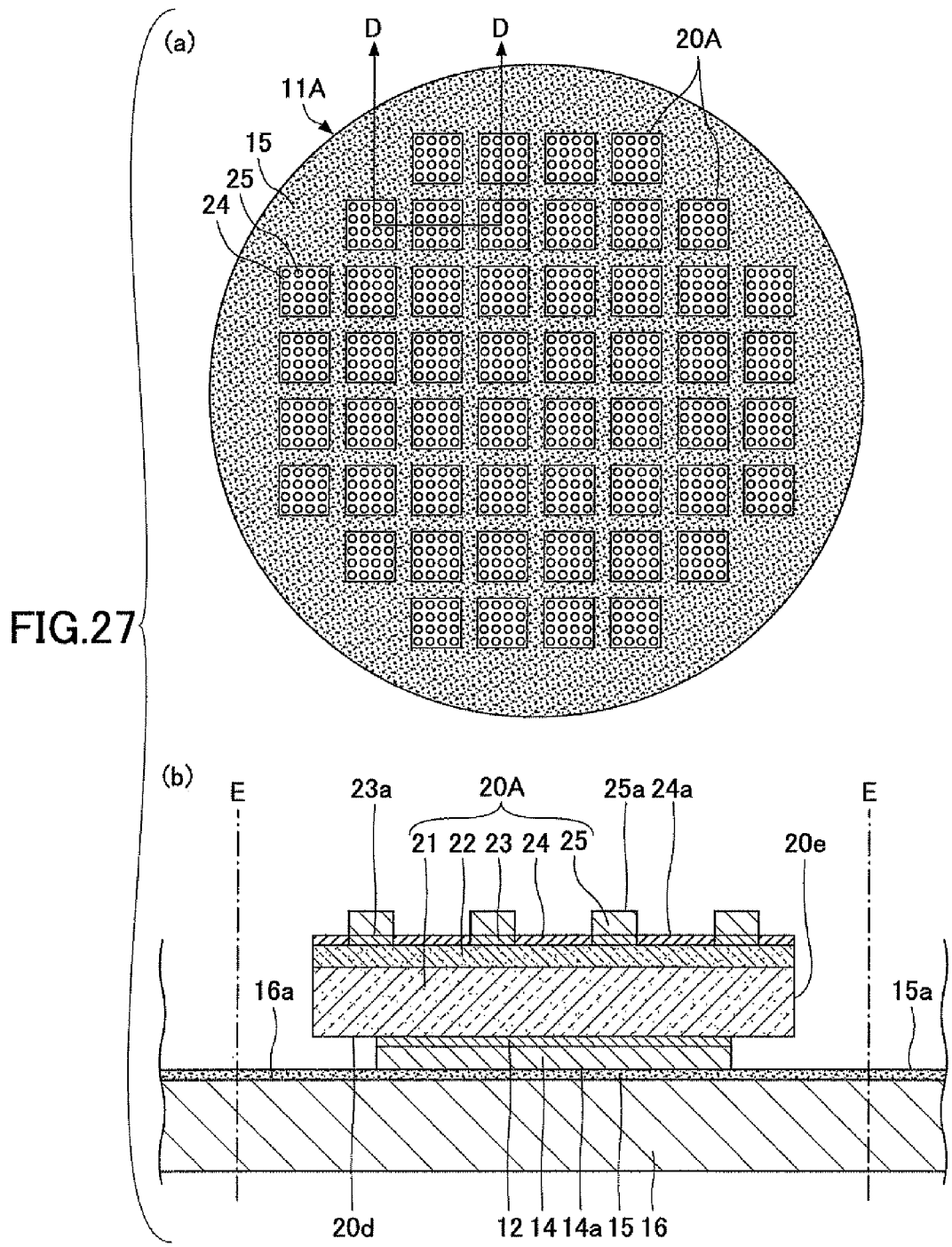
FIG. 27 is a second view showing a manufacturing process of the semiconductor package of the second embodiment.

Next, in a step shown in FIG. 27, by the processes shown in FIG. 9 through FIG. 12 of the first embodiment, the seed layer 12 and the metal layer 14 are stacked on the rear surface 20d of the semiconductor chip 20A. In addition, the semiconductor wafer 11A is cut in the cutting positions C by the dicing blade or the like so that the semiconductor chips 20A are formed. Then, each of the semiconductor chips 20A where the seed layer 12 and the metal layer 14 are stacked on the surface (rear surface) 20d is provided on the surface 16a of the supporting body 16 via the adhesive member 15 so that the surface 14a of the metal layer 14 faces the surface 15a of the adhesive 15, and then is pressed. As a result of this, each of the semiconductor chips 20 is fixed on the surface 16a of the supporting body 16 via the adhesive member 15 in a face-up state. A gap size between neighboring semiconductor chips 20A may be optional.

Figure 28:
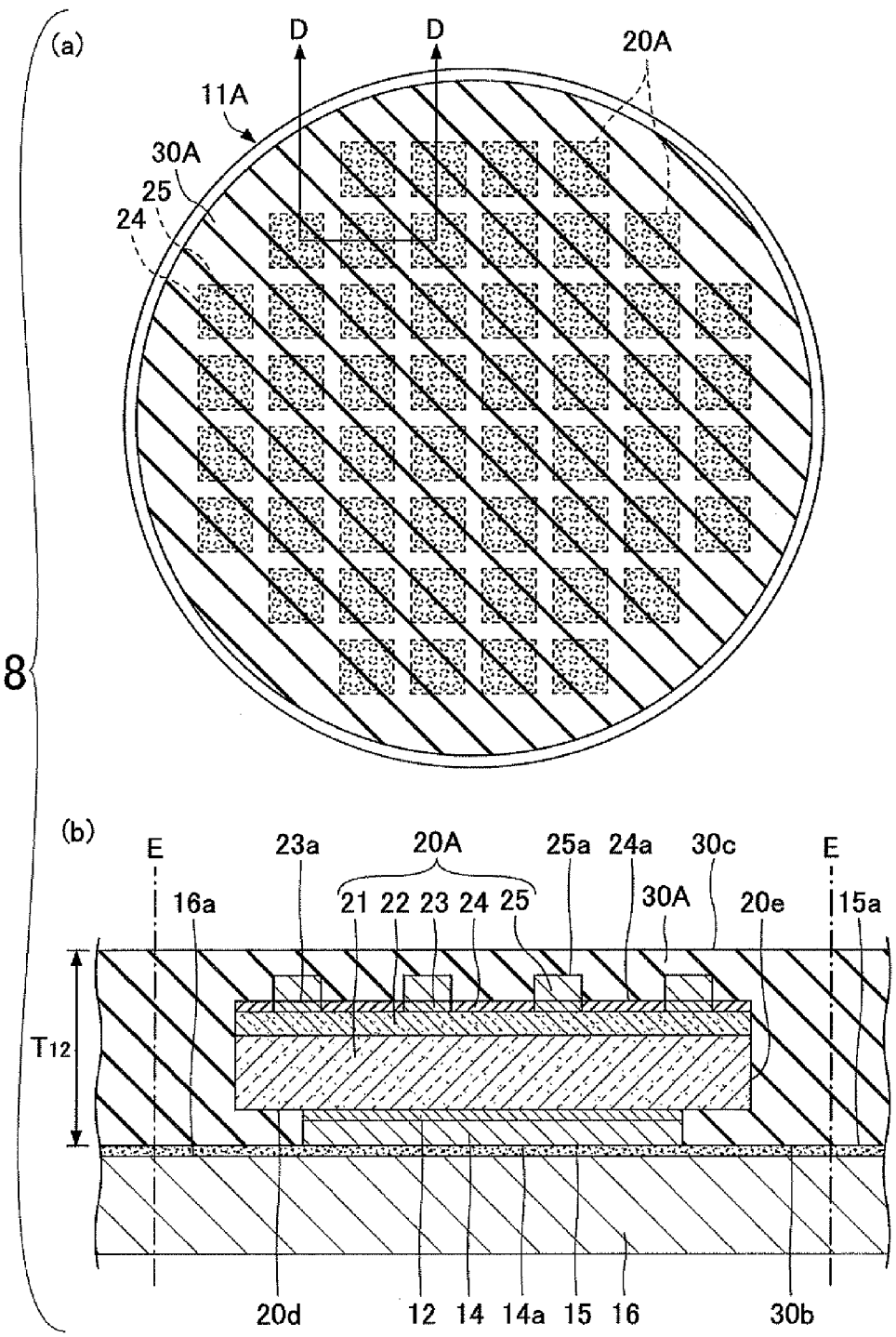
FIG. 28 is a third view showing a manufacturing process of the semiconductor package of the second embodiment.

Next, in a step shown in FIG. 28, the resin part 30A is formed on the surface 15a of the adhesive member 15 by a press-mold method or the like. The resin part 30A is configured to seal the seed layer 12, the metal layer 14, and the semiconductor chip 20A. Details of forming the resin part 30A are already discussed with reference to FIG. 15. The thickness $T_{12}$ from the surface 15a of the adhesive member 15 to the surface 30c of the resin part 30A can be, for example, equal to or greater than approximately 950 µm.

Figure 29:
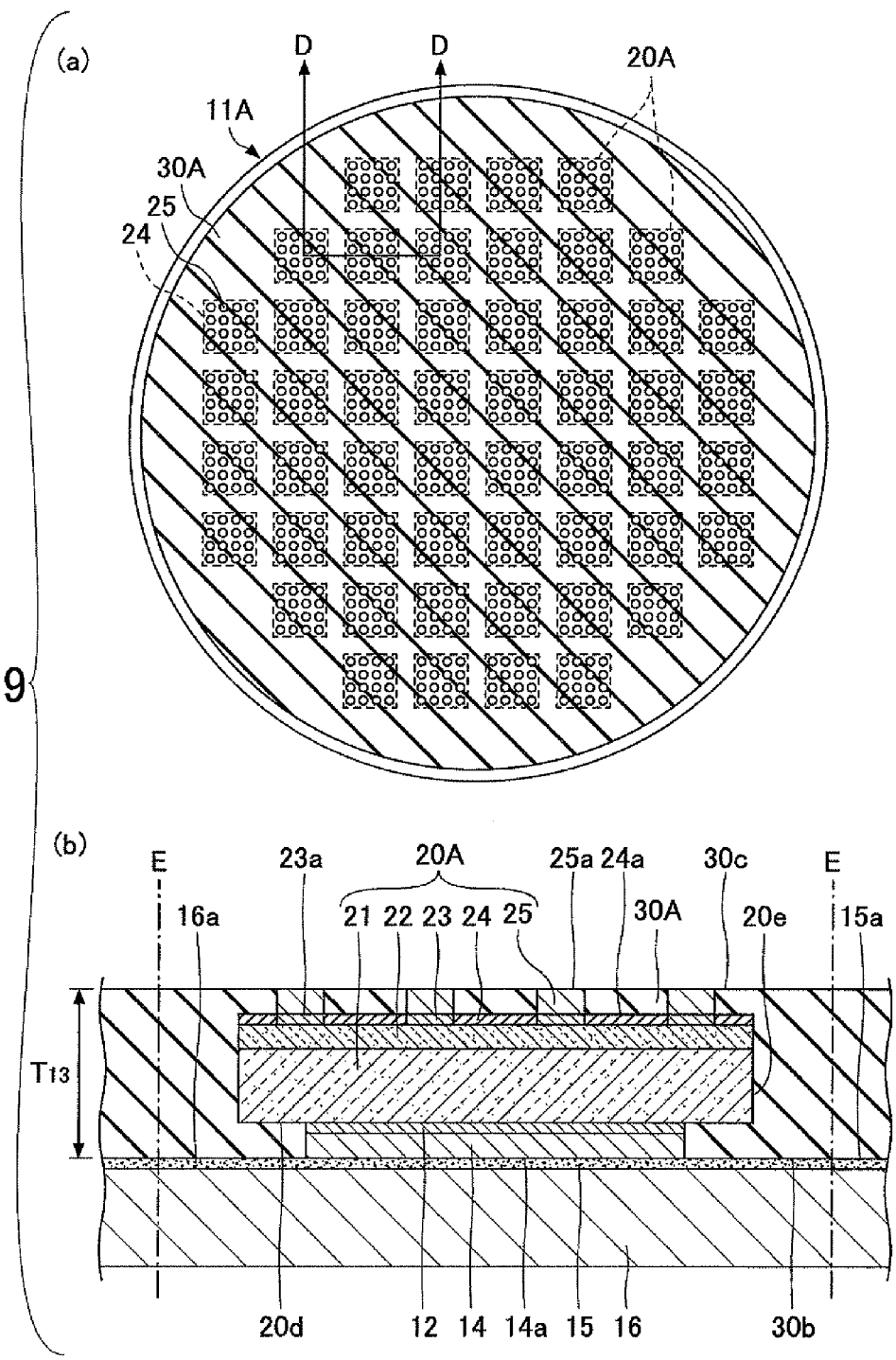
FIG. 29 is a fourth view showing a manufacturing process of the semiconductor package of the second embodiment.

Next, in a step shown in FIG. 29, the surface 30c of the resin part 30A shown in FIG. 28 is ground until the surfaces (upper end surfaces) 25a of the bumps 25 are exposed. For example, a grinder or the like can be used for grinding the resin part 30A. The thickness $T_{13}$ from the surface 15a of the adhesive member 15 to the surface 30c of the resin part 30A can be, for example, approximately 930 µm.

Figure 30:
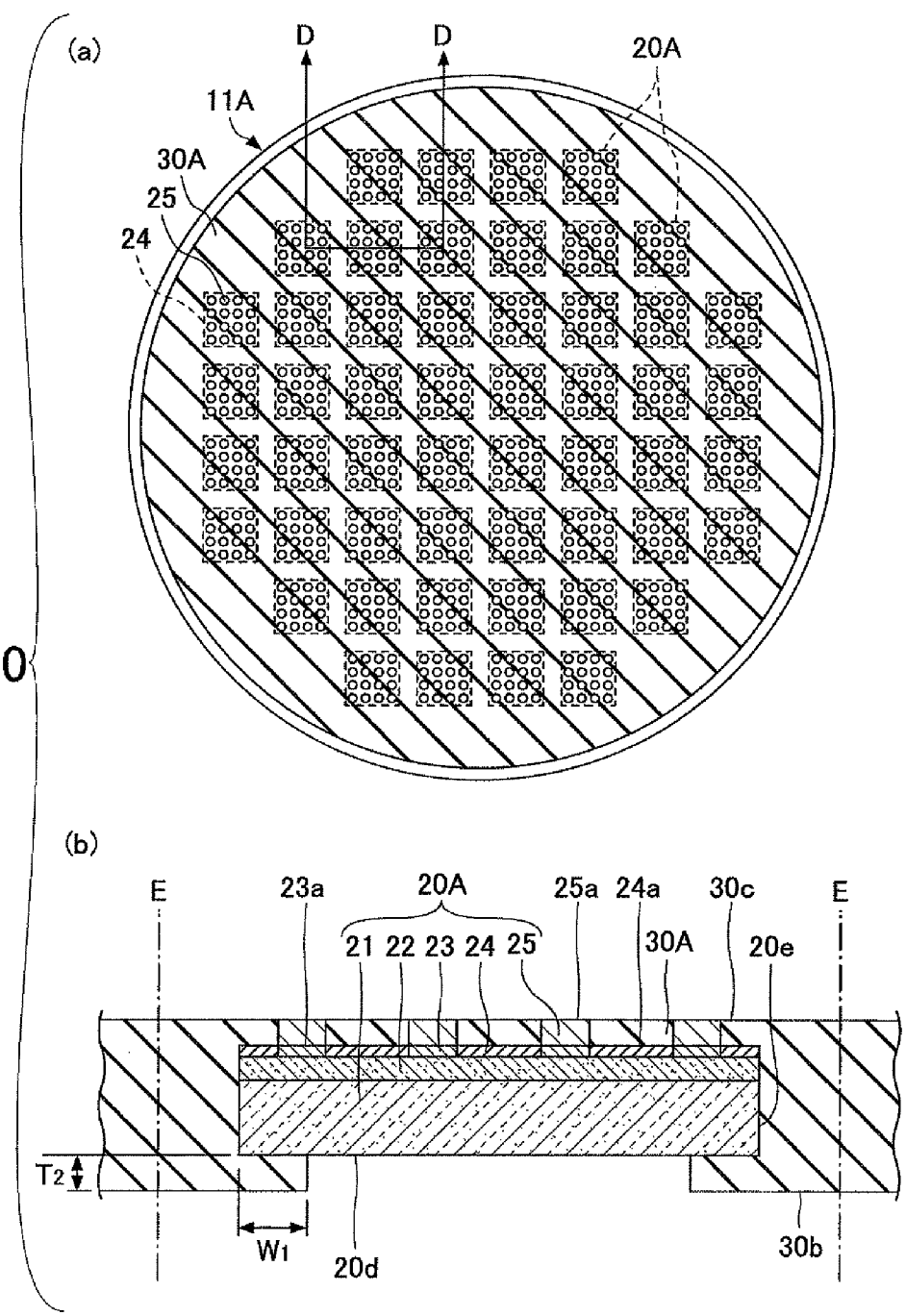
FIG. 30 is a fifth view showing a manufacturing process of the semiconductor package of the second embodiment.

Next, in a step shown in FIG. 30, the seed layer 12, the metal layer 14, the adhesive member 15, and the supporting body 16 shown in FIG. 29 are removed. The seed layer 12, the metal layer 14, and the supporting body 16 can be removed by etching using, for example, a ferric chloride solution or the like. As a result of this, the resin part 30A is formed so as to cover the surface (side surface) 20e of the semiconductor chip 20A and also cover, in a frame manner, the external edge part of the surface (rear surface) 20d. As a result of this, it is possible to prevent the semiconductor chip 20A from falling down from the resin part 30A. In addition, strength of the semiconductor package 10A can be improved when the semiconductor package 10A is eventually completed. The thickness $T_2$ of a portion of the resin part 30A which covers the external edge part of the surface (rear surface) 20d in the frame manner may be equal to or greater than approximately 50 µm and equal to or smaller than approximately 150 µm, for example, approximately 100 µm. The width W1 of the portion of the resin part 30 which covers the external edge part of the surface (rear surface) 20d in the frame manner may be equal to or greater than approximately 50 µm and equal to or smaller than approximately 150 µm, for example, approximately 50 µm. It is not necessary for this entire frame-shaped portion to have the same fixed width.

Next, a structural body manufactured by the substantially same processes as the processes shown in FIG. 18 through FIG. 23 of the first embodiment is cut so that the semiconductor package 10A shown in FIG. 25 is completed.

Thus, in the second embodiment, the step where the semiconductor chip having the bumps is formed and provided on the supporting body in the face-up manner (where the bumps face upward) is provided. Therefore, in the semiconductor package, the wiring structure is formed on the circuit forming surface of the semiconductor chip and the surface of the resin part being situated at the same side as the circuit forming surface in a state where the semiconductor chip and the resin part configured to cover the surface (side surface) of the semiconductor chip are a base body. The resin part is further formed so as to cover the external edge part of the rear surface of the semiconductor chip in a frame manner. Therefore, it is possible to achieve the same effect as that of the first embodiment.

The configuration of the resin part 30A formed on the surface 20d of the semiconductor chip 20A may be the same as that of the modified example of the first embodiment. In this case, it is possible to achieve the same effect as that of the modified example of the first embodiment.

Modified Example of the Second Embodiment

In the modified example of the second embodiment, instead of the press molding method, a transfer molding method is used for molding the resin part 30A.

Figure 31:
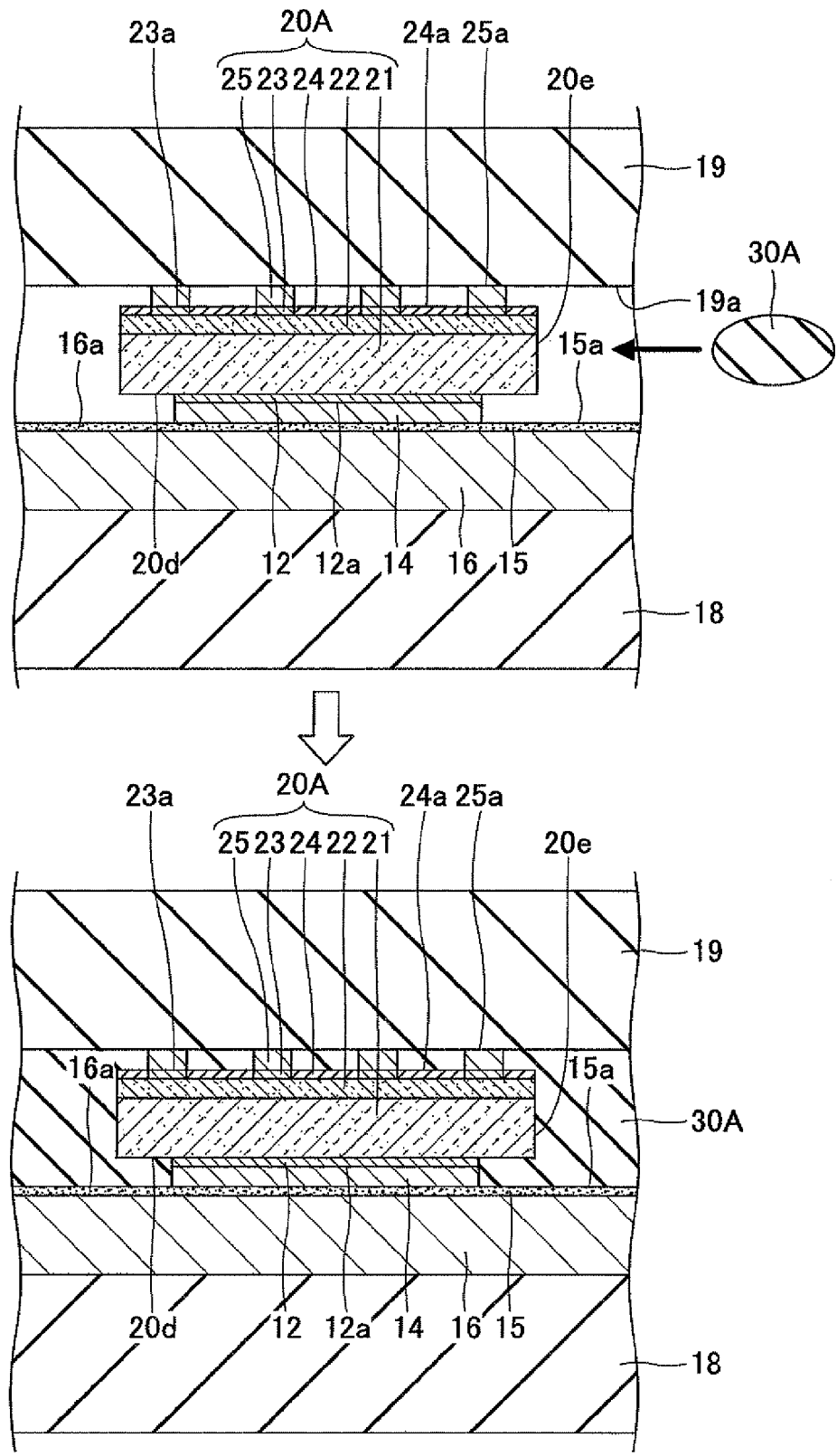
FIG. 31 is a view for explaining a transfer mold method.

In the transfer molding method, as shown in FIG. 31, the structural body shown in FIG. 27 is sandwiched by a lower mold 18 and an upper mold 19. As a result of this, the surfaces 25a of the bumps 25 are adhered to the surface 19a of the upper mold 19. In addition, an epoxy group resin or the like which is a material of the resin part 30A is heated and flows in the periphery part of the structural body shown in FIG. 27. After being pressed, the epoxy group resin or the like is cured. The heating process may be performed at the heating temperature of, for example, approximately 150° C. and for approximately five minutes. Since the surfaces (upper end surfaces) 25a of the bumps 25 are adhered to the surface 19a of the upper mold 19, the resin part 30A is not formed on the surfaces 25a of the bumps 25. Therefore, the surfaces 25a of the bumps 25 are exposed from the resin part 30A. As a result of this, the grinding process shown in FIG. 29 is not necessary.

According to the modified example of the second embodiment, it is possible to achieve not only the substantially same effect as that achieved by the second embodiment but also the following effect. That is, since the resin part is not formed on the upper surface of the bumps when the resin part is formed by the transfer molding method, it is not necessary to provide the step where the resin part is ground so that the upper surfaces of the bumps are exposed. Hence, it is possible to simplify the manufacturing method of the semiconductor package.

Instead of the press molding method, the transfer molding method may be used in the processes shown in FIG. 14 and FIG. 15 of the first embodiment. In this case, the grinding process exposing the metal layer 14 shown in FIG. 61 is not necessary. Hence, it is possible to simplify the manufacturing method of the semiconductor package.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

For example, in the semiconductor package 10 or the like, the wiring layer may be provided at a part of the wiring structure 40 above the surface 30a of the resin part 30 and the electrode pads may be provided on the wiring layer. In other words, it is possible to provide a fan-out structure in the semiconductor package of the embodiments of the present invention.

In addition, in the semiconductor package 10 or the like, a heat radiation component such as a heat spreader or the like may be connected to the rear surface 20b or the like of the semiconductor chip 20.

Furthermore, in the semiconductor package 10 or the like, it is not necessary to remove the metal layer 14 so that the metal layer 14 may remain. In this case, since the rear surface of the semiconductor package 10 or the like is flat, it is possible to achieve the effect where the heat radiation component such as a heat spreader or the like may be easily connected.

According to the above-discussed embodiments of the present invention, it is possible to provide a semiconductor package whereby it is possible to prevent a semiconductor chip from falling down from a resin part so that strength of the semiconductor package can be improved, and a manufacturing method of the semiconductor package.

What is claimed is:

1. A semiconductor package, comprising:
    a semiconductor chip;
    a resin part configured to cover a side surface of the semiconductor chip; and
    a wiring structure formed on a circuit forming surface of the semiconductor chip and a surface of the resin part being situated at the same side as the circuit forming surface, the wiring structure being electrically connected to the semiconductor chip,
    wherein the resin part is formed so as to only cover a part of a surface of the semiconductor chip situated at an opposite side to the circuit forming surface of the semiconductor chip leaving another part of the surface of the semiconductor chip exposed to an outside of the semiconductor package,
    wherein the resin part contacts and covers the circuit forming surface of the semiconductor chip,
    wherein the wiring structure being electrically connected to the semiconductor chip is formed on the surface of the resin part opposite to a contact surface contacting the circuit forming surface,
    wherein the semiconductor chip includes an electrode and a bump formed on the electrode,
    wherein the bump is exposed from the surface of the resin part,
    wherein the wiring structure is formed by laminating an insulation layer and a wiring layer,
    wherein the insulation layer is formed by covering the surface of the resin part,
    wherein the insulation layer has a via hole, from which the bump of the semiconductor chip is exposed for electrical connection,
    wherein the wiring layer is arranged on the insulation layer, and a via conductor of the wiring layer is provided inside the via hole for connecting the wiring layer to the bump.

2. The semiconductor package as claimed in claim 1,
    wherein the resin part is formed so as to cover, in a frame manner, an external edge part of the surface situated at the side opposite to the circuit forming surface of the semiconductor chip.

3. The semiconductor package as claimed in claim 1,
    wherein the resin part is formed so as to cover a corner part of the surface situated at the side opposite to the circuit forming surface of the semiconductor chip.

4. The semiconductor package as claimed in claim 1,
    wherein the resin part is formed so as to cover, in a diagonal manner, an external edge part of the surface situated at the side opposite to the circuit forming surface of the semiconductor chip.

5. The semiconductor package as claimed in claim 1,
    wherein the wiring structure is formed by laminating an insulation layer and a wiring layer, and the wiring layer includes an electrode pad so as to be connected to an outside of the semiconductor package.

6. The semiconductor package as claimed in claim 1,
    wherein the wiring structure is formed by laminating a plurality of insulation layers and a plurality of wiring layers.

7. The semiconductor package as claimed in claim 1,
    wherein the wiring structure is formed by laminating an insulation layer and a wiring layer,
    wherein the insulation layer is formed by covering the circuit forming face of the semiconductor chip and the surface of the resin part,
    wherein the insulation layer has a via hole, from which an electrode for electrically connecting the semiconductor chip to the wiring structure is exposed,
    wherein the wiring layer is arranged on the insulation layer, and a via conductor of the wiring layer is provided inside the via hole for connecting the wiring layer to the electrode.

* * * * *